(12) United States Patent
Jo et al.

(10) Patent No.: US 11,974,485 B2
(45) Date of Patent: Apr. 30, 2024

(54) DISPLAY DEVICE

(71) Applicant: SAMSUNG DISPLAY CO., LTD., Yongin-si (KR)

(72) Inventors: Kangmoon Jo, Yongin-si (KR); Sungjae Moon, Yongin-si (KR); Ansu Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/807,872

(22) Filed: Jun. 21, 2022

(65) Prior Publication Data
US 2022/0328566 A1 Oct. 13, 2022

Related U.S. Application Data

(63) Continuation of application No. 16/925,993, filed on Jul. 10, 2020, now Pat. No. 11,367,756.

(30) Foreign Application Priority Data

Oct. 8, 2019 (KR) .................. 10-2019-0124771

(51) Int. Cl.
H10K 59/38 (2023.01)
H10K 50/115 (2023.01)
(Continued)

(52) U.S. Cl.
CPC ........... *H10K 59/38* (2023.02); *H10K 50/115* (2023.02); *H10K 50/865* (2023.02); *H10K 59/131* (2023.02); *H10K 59/352* (2023.02)

(58) Field of Classification Search
CPC .. H10K 50/115; H10K 50/805; H10K 50/865; H10K 59/12; H10K 59/121; H10K 59/131; H10K 59/35–38
See application file for complete search history.

(56) References Cited

U.S. PATENT DOCUMENTS 8,653,729 B2   2/2014  Choi et al.
10,020,461 B2  7/2018  Park et al.
(Continued)

FOREIGN PATENT DOCUMENTS

KR  10-2016-0047133  5/2016
KR  10-2017-0014728  2/2017
(Continued)

Primary Examiner — Andres Munoz
(74) Attorney, Agent, or Firm — F. CHAU & ASSOCIATES, LLC

(57) ABSTRACT

A display device include a light-emitting panel having first to third light-emitting diodes and a color panel on the light-emitting panel. The color panel includes first to third color areas that transmit light of different colors and a light-blocking area. The light-emitting panel includes two first power lines spaced apart from each other, connecting electrodes electrically connected to the two first power lines, and an insulating layer on the connecting electrodes, the insulating layer having openings each of which exposing a respective one of the connecting electrodes. The first light-emitting diode, the second light-emitting diode, and the third light-emitting diode are spaced apart from one another between the two first power lines. The second color area is smaller than each of the first color area and the third color area in size. The second color area is disposed between the first color area and the third color area.

20 Claims, 17 Drawing Sheets

(51) Int. Cl.
 *H10K 50/86* (2023.01)
 *H10K 59/131* (2023.01)
 *H10K 59/35* (2023.01)

(56) References Cited

U.S. PATENT DOCUMENTS

| | | |
|---|---|---|
| 10,283,581 B2 | 5/2019 | Kim |
| 2012/0038267 A1* | 2/2012 | Hanamura ............. H10K 59/38 |
| | | 313/504 |
| 2016/0240603 A1 | 8/2016 | Park et al. |
| 2018/0019434 A1 | 1/2018 | Park et al. |
| 2018/0102499 A1 | 4/2018 | Pyo et al. |
| 2020/0119115 A1* | 4/2020 | Moon ................ H10K 59/1216 |
| 2021/0091163 A1* | 3/2021 | Son ..................... H01L 27/1225 |
| 2021/0104578 A1 | 4/2021 | Jo et al. |

FOREIGN PATENT DOCUMENTS

| | | |
|---|---|---|
| KR | 10-2018-0009441 | 1/2018 |
| KR | 10-2018-0040765 | 4/2018 |

\* cited by examiner

DISPLAY DEVICE

CROSS-REFERENCE TO RELATED APPLICATION

This application is a continuation of U.S. application Ser. No. 16/925,993 filed on Jul. 10, 2020 which claims priority under 35 U.S.C. § 119 to Korean Patent Application No. 10-2019-0124771, filed on Oct. 8, 2019, in the Korean Intellectual Property Office, the disclosure of which is incorporated by reference herein in its entirety.

BACKGROUND

1. Field

The present invention relates to a display device. More particularly, the present invention relates to a display device having different color areas.

2. Description of Related Art

As a display field for visually expressing various electrical signal information has rapidly developed, various display devices having excellent characteristics such as a small thickness, light weight, and low power consumption, etc. have been introduced.

Display devices may include a liquid crystal display device, in which light is emitted from a backlight without emitting light by itself, or a light-emitting display device including a display element that may emit light. A light-emitting display device may include a pixel electrode, an opposite electrode, and display elements including an emission layer between the pixel electrode and the opposite electrode.

SUMMARY

One or more exemplary embodiments include a display device, and more particularly, a structure of a light-emitting display device.

Additional aspects will be set forth in part in the description which follows and, in part, will be apparent from the description, or may be learned by practice of the presented embodiments of the disclosure.

According to an exemplary embodiment of the present invention, a display device include a light-emitting panel having a first light-emitting diode, a second light-emitting diode, and a third light-emitting diode, and a color panel on the light-emitting panel. The color panel includes a first color area, a second color area, a third color area, and a light-blocking area. The first color area, the second color area, and the third color area transmit light of different colors. The light-emitting panel includes two first power lines spaced apart from each other, connecting electrodes electrically connected to the two first power lines, and an insulating layer on the connecting electrodes, the insulating layer having openings each of which exposing a respective one of the connecting electrodes. The first light-emitting diode, the second light-emitting diode, and the third light-emitting diode are spaced apart from one another between the two first power lines. The second color area is smaller than each of the first color area and the third color area in size. The second color area is disposed between the first color area and the third color area.

According to an exemplary embodiment of the present invention, a display device includes two first power lines spaced apart from each other, connecting electrodes overlapping the two first power lines, an insulating layer disposed on the connecting electrodes and including openings respectively exposing the connecting electrodes, and a first light-emitting diode, a second light-emitting diode, and a third light-emitting diode between the two neighboring first power lines. The first light-emitting diode, the second light-emitting diode, and the third light-emitting diode are spaced apart from one another between the two first power lines.

BRIEF DESCRIPTION OF THE DRAWINGS

The above and other aspects, features, and advantages of certain exemplary embodiments of the disclosure will be more apparent from the following description taken in conjunction with the accompanying drawings, in which.

DETAILED DESCRIPTION OF EXEMPLARY EMBODIMENTS

Figure 1A:
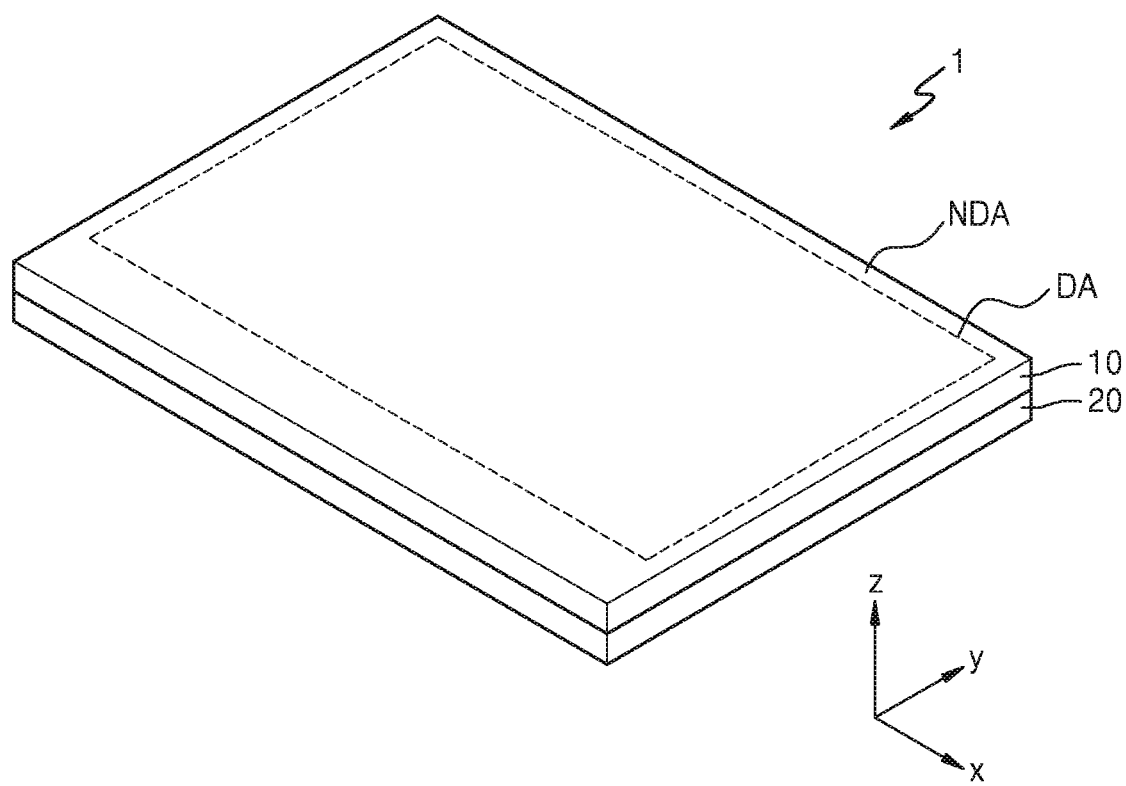
FIG. 1A is a perspective view of a display device according to an exemplary embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Throughout the disclosure, the expression "at least one of a, b and c" indicates only a, only b, only c, both a and b, both a and c, both b and c, all of a, b, and c, or variations thereof.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present. Sizes of components in the drawings may be exaggerated for convenience of explanation.

In other words, since sizes and thicknesses of components in the drawings are arbitrarily illustrated for convenience of explanation, the following embodiments are not limited thereto. When a certain embodiment may be implemented differently, a specific process order may be performed differently from the described order.

For example, two consecutively described processes may be performed substantially at the same time or performed in an order opposite to the described order. In the embodiments below, when layers, areas, or elements or the like are referred to as being "connected," it will be understood that they may be directly connected or an intervening portion may be present between layers, areas or elements.

For example, when layers, areas, or elements or the like are referred to as being "electrically connected," they may be directly electrically connected, or layers, areas or elements may be indirectly electrically connected and an intervening portion may be present.

Figure 1B:
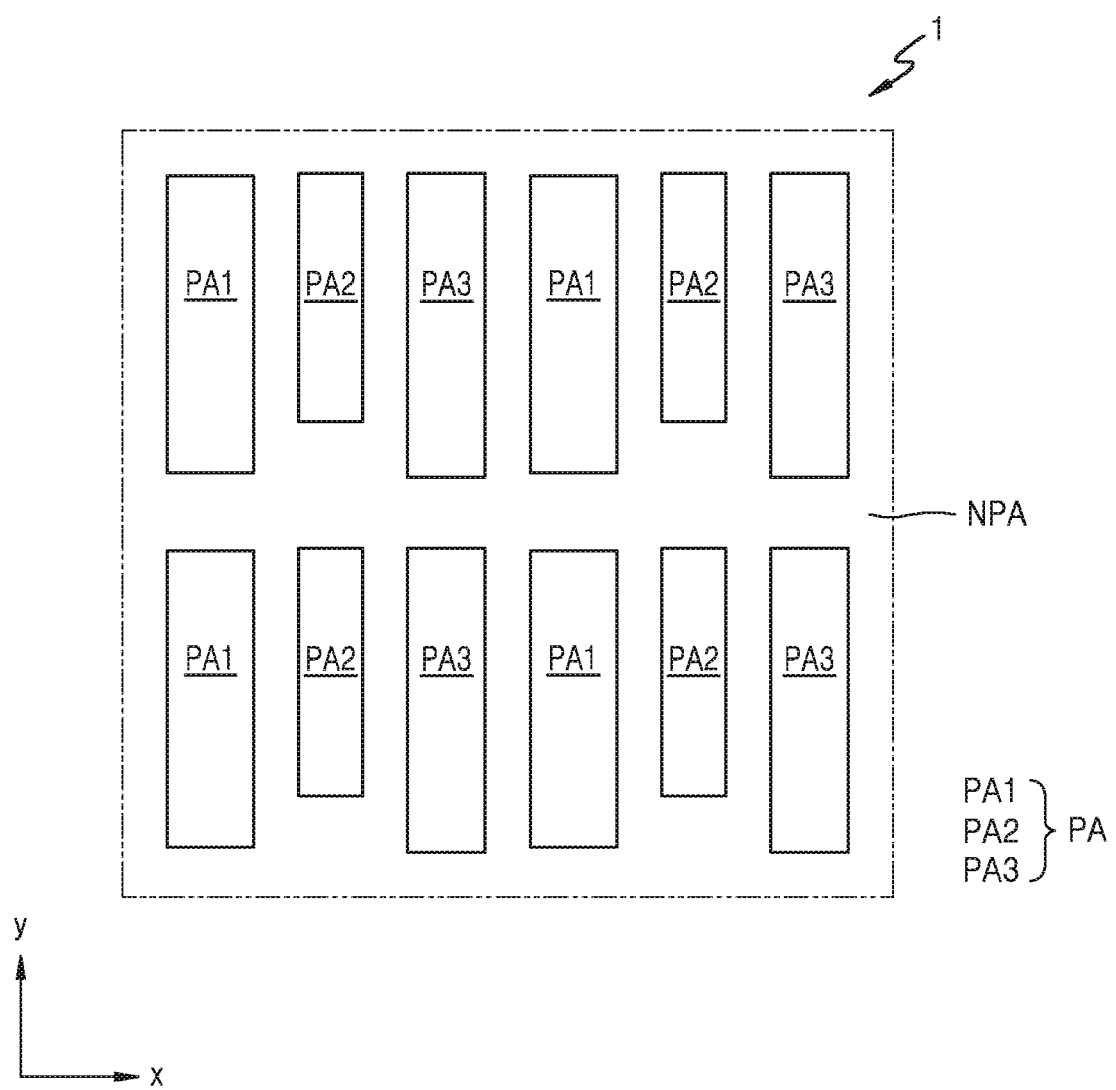
FIG. 1B is a plan view showing an enlarged view of a display area in a display device according to an exemplary embodiment of the present invention.

FIG. 1A is a perspective view of a display device 1 according to an exemplary embodiment, and FIG. 1B is a plan view showing a partially enlarged view of a display area DA in the display device 1 according to the exemplary embodiment. Referring to FIG. 1A, the display device 1 may include a display area DA emitting light and a non-display area NDA not emitting light. The non-display area NDA is adjacent to the display area DA and may surround (e.g., entirely surround) the display area DA. In an exemplary embodiment, the display area DA may have a rectangular shape having longer sides in ±x-directions.

Alternatively, the display area DA may have a rectangular shape having longer sides in ±y-directions, a square shape, or a polygonal shape. The display device 1 may provide a predetermined image via light emitted from a plurality of pixel areas PA in the display area DA. In this regard, FIG. 1B shows first to third pixel areas PA1, PA2, and PA3 arranged in the x-direction and the y-direction. The first to third pixel areas PA1, PA2, and PA3 may emit light of different colors from one another. In an exemplary embodiment, the first pixel area PA1 may be a red pixel area emitting red light, the second pixel area PA2 may be a blue pixel area emitting blue light, and the third pixel area PA3 may be a green pixel area emitting green light.

The first to third pixel areas PA1, PA2, and PA3 may be surrounded by non-pixel areas NPA therebetween.

The display device 1 may include a light-emitting panel 20 and a color panel 10 stacked in a thickness direction (z-direction) of the display device 1.

Figure 2A:
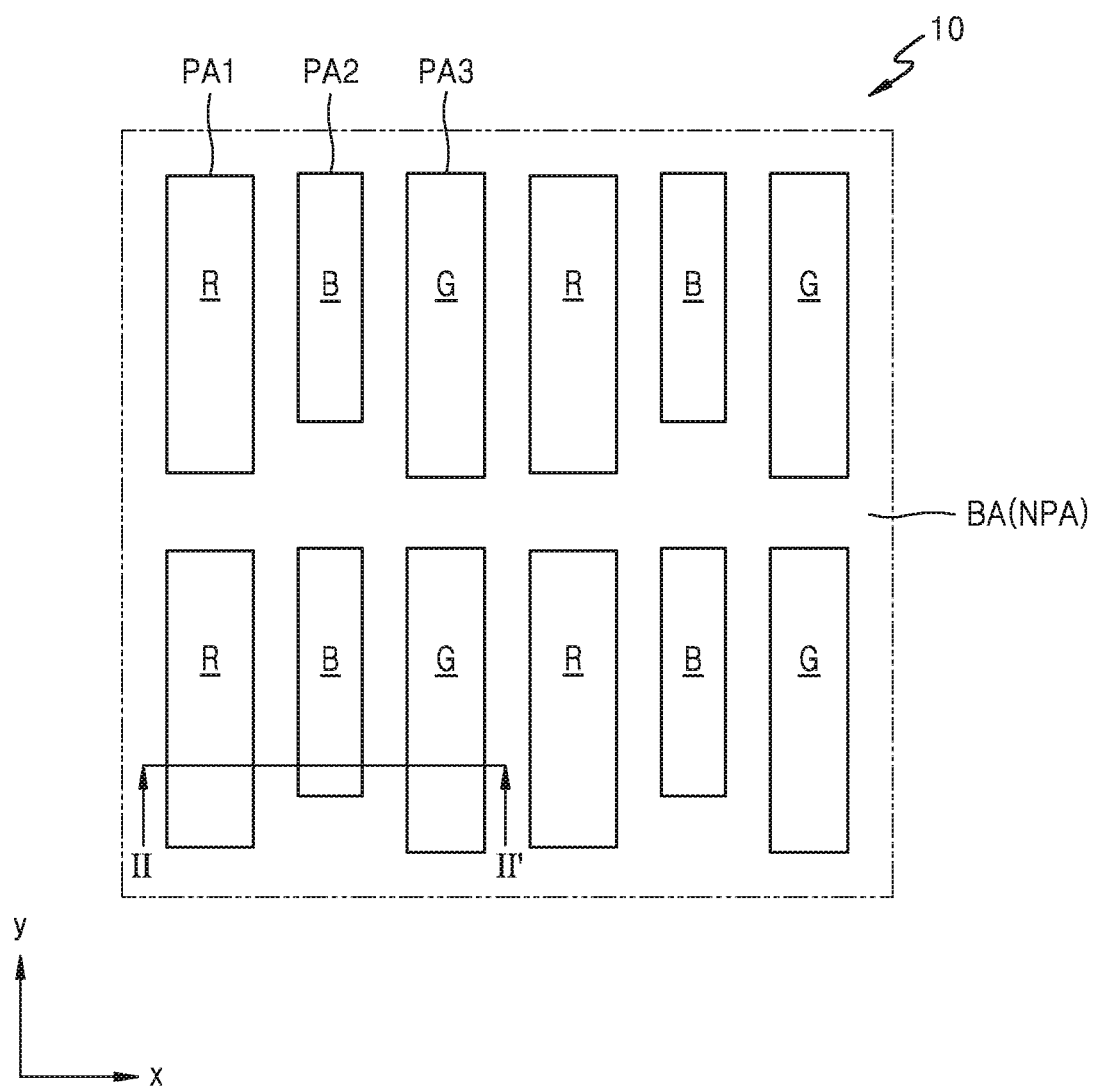
FIG. 2A is a plan view of a color panel according to an exemplary embodiment of the present invention.
Figure 2B:
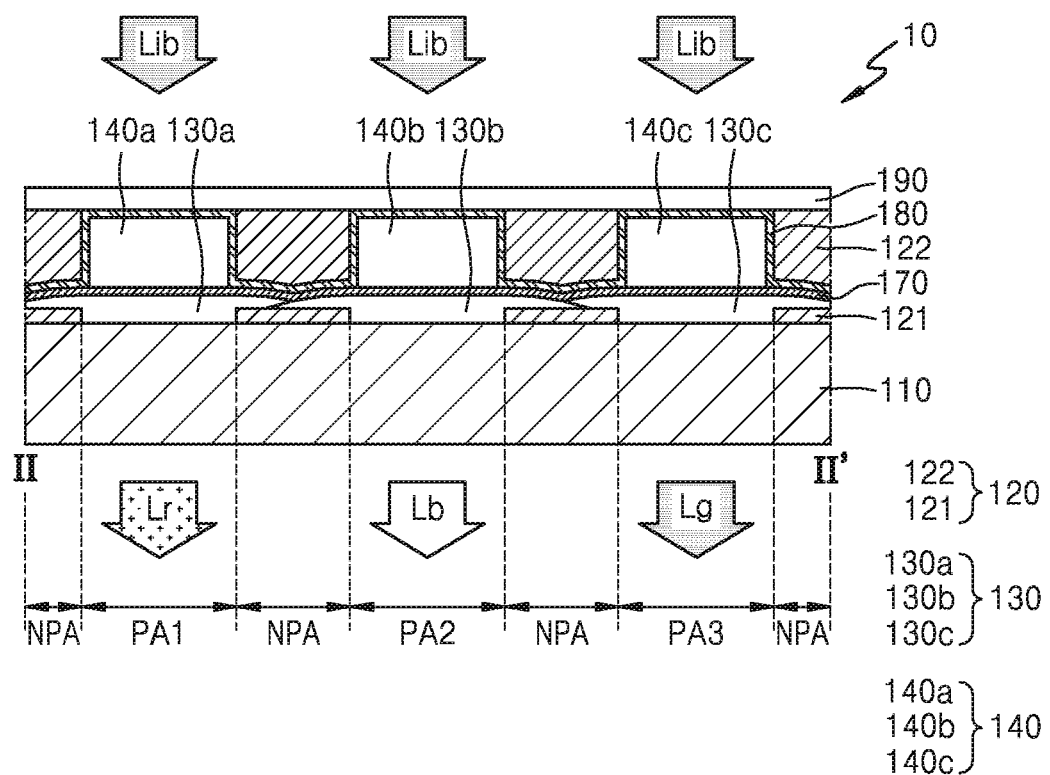
FIG. 2B is a cross-sectional view of a color panel according to an exemplary embodiment of the present invention.

FIG. 2A is a plan view of the color panel 10 according to the embodiment, and FIG. 2B is a cross-sectional view of the color panel 10 taken along line II-II' of FIG. 2A. Referring to FIGS. 2A and 2B, the color panel 10 may include first to third color areas R, B and G that may emit light of various colors and a light-blocking area BA surrounding the first to third color areas R, B, and G. The first to third color areas R, B, and G may pass the light and are surrounded by the light-blocking area BA.

The light-blocking area BA may block the light and may be configured as a mesh type among the first to third color areas R, B, and G.

The first to third color areas R, B, and G may be substantially the same as the first to third pixel areas PA1, PA2, and PA3 described above with reference to FIG. 1B, and the light-blocking area BA may be substantially the same as the non-pixel area NPA described above with reference to FIG. 1B. In an exemplary embodiment, the first to third color areas R, B, and G may be substantially the same, with respect to area and shape, as the first to third pixel areas PA1, PA2, and PA3 as described above with reference to FIG. 1B, and the light-blocking area BA may be substantially the same, with respect to area and shape, as the non-pixel area NPA described above with reference to FIG. 1B. In an exemplary embodiment, the first to third color areas R, B, and G may overlap the first to third pixel areas PA1, PA2, and PA3, and the light-blocking area BA may overlap the non-pixel area NPA. The first to third color areas R, B, and G may be distinguished according to light emitted therefrom.

For example, the first color area R (see FIG. 2A) may emit first color light Lr (see FIG. 2B), the second color area B (see FIG. 2A) may emit second color light Lb (see FIG. 2B), and the third color area G (see FIG. 2A) may emit third color light Lg (see FIG. 2B). The first color light Lr may denote red light, the second color light Lb may denote blue light, and the third color light Lg may denote green light. The red light may have a peak wavelength of about 580 nm to about 750 nm. The green light may have a peak wavelength of about 495 nm to about 580 nm.

The blue light may have a peak wavelength of about 400 nm to about 495 nm. Incident light Lib may be second color light and may change the color thereof or transmit while passing through the first to third color areas R, B, and G.

Therefore, the first to third color light Lr, Lb, and Lg may be emitted from the color panel 10. The color panel 10 may include a first substrate 110, a light-blocking layer 120, a color layer 130, and a color conversion-transmission layer 140, as shown in FIG. 2B. The first substrate 110 is a light-transmitting substrate and may include a transparent glass material or a transparent resin material. The first substrate 110 may include a transparent glass substrate mainly including $SiO_2$. In an exemplary embodiment, the first substrate 110 may include a polymer resin.

The polymer resin may include polyethersulfone, polyacrylate, polyether imide, polyethylene naphthalate, polyethylene terephthalate, polyphenylene sulfide, polyarylate, polyimide, polycarbonate, cellulose tri-acetate, cellulose acetate propionate, etc. The light-blocking layer 120 may include a first light-blocking layer 121 and a second light-blocking layer 122. The first light-blocking layer 121 is disposed under the color layer 130 and the second light-blocking layer 122 may be on the color layer 130.

FIG. 2B shows that the light-blocking layer 120 includes the first light-blocking layer 121 and the second light-blocking layer 122, but in an exemplary embodiment, one of the first light-blocking layer 121 and the second light-blocking layer 122 may be omitted. The first light-blocking layer 121 and the second light-blocking layer 122 may have various colors, e.g., black or white, black or blue, etc. For example, one of the first light-blocking layer 121 and the second light-blocking layer 122 (e.g., second light-blocking layer 122) may be black, and the other (e.g., first light-blocking layer 121) may be white or blue. Alternatively, the first light-blocking layer 121 and the second light-blocking layer 122 may have the same color as each other. The first light-blocking layer 121 and/or the second light-blocking layer 122 may include an opaque inorganic insulating material such as chromium oxide or molybdenum oxide, or an opaque insulating material such as a black resin. The first light-blocking layer 121 and/or the second light-blocking layer 122 may include an organic insulating material such as a white resin, a blue resin, etc.

In an exemplary embodiment, when the first light-blocking layer 121 includes an organic insulating material of blue color, the first light-blocking layer 121 may include the same material as that of a second color filter 130b in the color layer 130 and may be manufactured together with the second color filter 130b when the second color filter 130b is manufactured. The color layer 130 may include a pattern of an organic material including a pigment or a dye. The color layer 130 may include a color filter in each of pixel areas.

The color layer 130 may include a first color filter 130a in the first pixel area PA1, the second color filter 130b in the second pixel area PA2, and a third color filter 130c in the third pixel area PA3. The first color filter 130a may include a first color (e.g., red) pigment or dye on the first substrate 110. The first color filter 130a may be obtained by forming a first photosensitive color layer including the first color pigment or dye and patterning the first photosensitive color layer. The second color filter 130b may include a second color (e.g., blue) pigment or dye on the first substrate 110. The second color filter 130b may be obtained by forming a second photosensitive color layer including the second color (e.g., blue) pigment or dye and patterning the second photosensitive color layer. The third color filter 130c may include a third color (e.g., green) pigment or dye on the first substrate 110. The third color filter 130c may be obtained by forming a third photosensitive color layer including the third color pigment or dye and patterning the third photosensitive color layer. The color conversion-transmission layer 140 may be on the color layer 130. The color conversion-transmission layer 140 may include a color conversion portion or a transmission portion in each of the pixel areas PA1 to PA3.

The color conversion-transmission layer 140 may include a first color conversion portion 140a in the first pixel area PA1 (or first color area R, FIG. 2A), a transmission portion 140b in the second pixel area PA2 (or second color area B, FIG. 2A), and a second color conversion portion 140c in the third pixel area PA3 (or third color area G, FIG. 2A). The first color conversion portion 140a overlaps the first color filter 130a in the first pixel area PA1 to convert the incident light Lib into the first color light Lr.

The first color conversion portion 140a may include first quantum dots that are excited by the incident light Lib to emit the first color light Lr having a longer wavelength than that of the incident light Lib. The transmission portion 140b may overlap the second color filter 130b in the second pixel area PA2 and may transmit the incident light Lib. Thus, the second color light Lb may be emitted through the transmission portion 140b and the second color filter 130b. The second color light Lb is blue light having a peak wavelength within the same wavelength range as that of the incident light Lib.

The transmission portion 140b may include scattering particles for increasing an optical efficiency. The second color conversion portion 140c overlaps the third color filter 130c in the third pixel area PA3 to convert the incident light Lib into the third color light Lg.

The second color conversion portion 140c may include second quantum dots that are excited by the incident light Lib to emit the second color light Lg having a longer wavelength than that of the incident light Lib.

The first color conversion portion 140a, the transmission portion 140b, and the second color conversion portion 140c may be respectively formed by an inkjet printing method within concave spaces defined by the light-blocking layer 120, e.g., the second light-blocking layer 122. A barrier layer may be under and/or over the color conversion-transmission layer 140.

In this regard, FIG. 2B shows that a first barrier layer 170 is under the color conversion-transmission layer 140 and a second barrier layer 180 is on the color conversion-transmission layer 140. For example, each of the first color conversion portion 140a, the transmission portion 140b and the second color conversion portion 140c may be disposed between the first barrier layer 170 and the second barrier layer 180. The first barrier layer 170 and the second barrier layer 180 may include an inorganic insulating material, e.g., silicon nitride, silicon oxide, or silicon oxynitride.

FIG. 2B shows both the first barrier layer 170 and the second barrier layer 180, but in an exemplary embodiment, one of the first barrier layer 170 and the second barrier layer 180 may be omitted. An overcoat layer 190 may be on the second barrier layer 180. The overcoat layer 190 may include an organic material such as a resin, and the organic material may be transparent. An upper surface of the overcoat layer 190, e.g., a second surface opposite a first surface facing the color conversion-transmission layer 140, may be flat.

FIG. 2B shows that the color panel 10 includes the overcoat layer 190, but in an exemplary embodiment, the overcoat layer 190 may be omitted.

Figure 3:
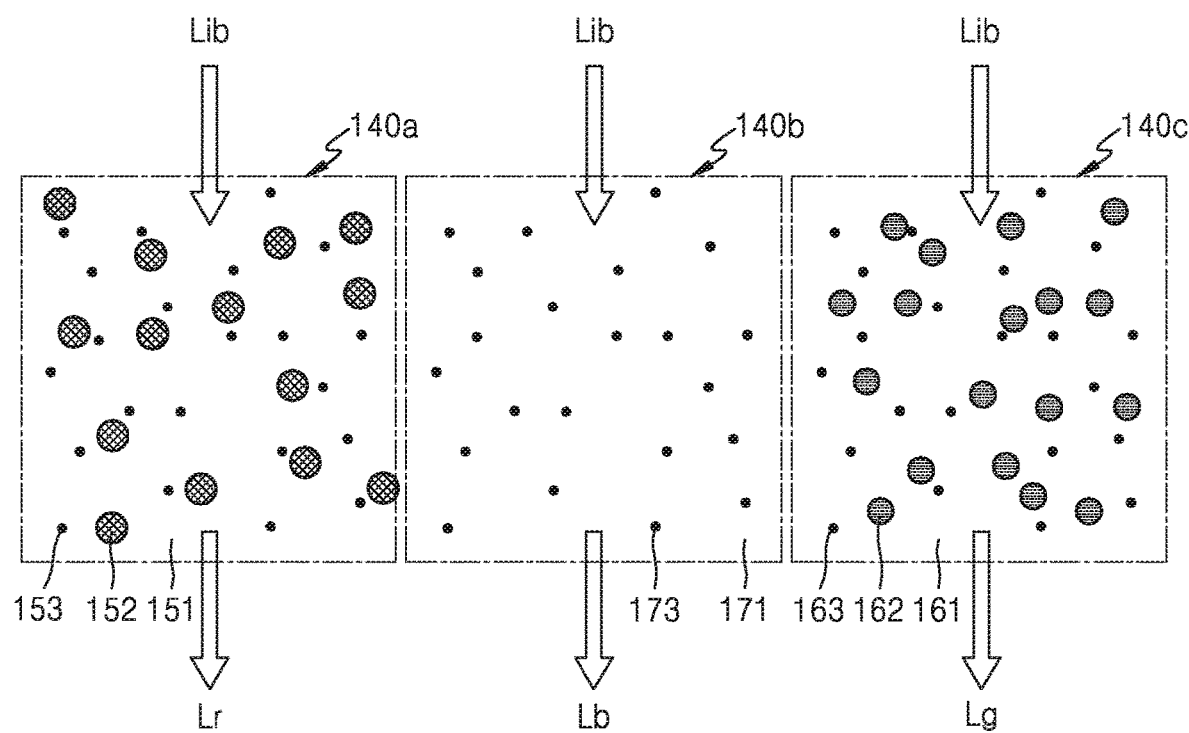
FIG. 3 is a diagram showing each of portions in a color conversion-transmission layer according to an exemplary embodiment of the present invention.

FIG. 3 is a diagram showing each of portions in the color conversion-transmission layer 140 according to an exemplary embodiment. Referring to FIG. 3, the first color conversion portion 140a converts the blue incident light Lib to the first color light Lr.

The first color conversion portion 140a may include a first photosensitive polymer 151 in which first quantum dots 152 and first scattering particles 153 are dispersed. The first quantum dots 152 are excited by the blue incident light Lib and may isotropically emit the first color light Lr having a longer wavelength than that of blue incident light Lib. The first photosensitive polymer 151 may include an organic material transmitting light. The first scattering particles 153 scatter the blue incident light Lib that is not absorbed by the first quantum dots 152 to make more first quantum dots 152 excited, and thus may increase a color conversion ratio of the first color conversion portion 140a. The first scattering particles 153 may include, for example, titanium oxide ($TiO_2$) or metal particles.

The first quantum dots 152 may be selected from a Group II-VI compound, a Group III-V compound, a Group IV-VI compound, a Group IV element, a Group IV compound, and a combination thereof. The second color conversion portion 140c converts the blue incident light Lib into the third color light Lg.

The second color conversion portion 140c may include a second photosensitive polymer 161 in which second quantum dots 162 and second scattering particles 163 are dispersed. The second quantum dots 162 are excited by the blue incident light Lib and may isotropically emit the third color light Lg having a longer wavelength than that of the blue incident light Lib. The second photosensitive polymer 161 includes an organic material transmitting light and may include the same material as that of the first photosensitive polymer 151. The second scattering particles 163 scatter the blue incident light Lib that is not absorbed by the second quantum dots 162 to make more second quantum dots 162 excited, and thus may increase a color conversion ratio of the second color conversion portion 140c. The second scattering particles 163 may include, for example, titanium oxide ($TiO_2$) or metal particles, and may include the same material as that of the first scattering particles 153. The second quantum dots 162 may be selected from a Group II-VI compound, a Group III-V compound, a Group IV-VI compound, a Group IV element, a Group IV compound, and a combination thereof.

The second quantum dots 162 may include the same material as that of the first quantum dots 152, and sizes of the second quantum dots 162 may be less than those of the first quantum dots 152. The transmission portion 140b may transmit the blue incident light Lib. The transmission portion 140b may include a third photosensitive polymer 171 in which third scattering particles 173 are dispersed. The third photosensitive polymer 171 may include, for example, an organic material transmitting light, such as a silicon resin, an epoxy resin, etc., and may include the same material as that of the first and second photosensitive polymers 151 and 161.

The third scattering particles 173 may scatter and emit the blue incident light Lib and may include the same material as those of the first and second scattering particles 153 and 163.

Figure 4A:
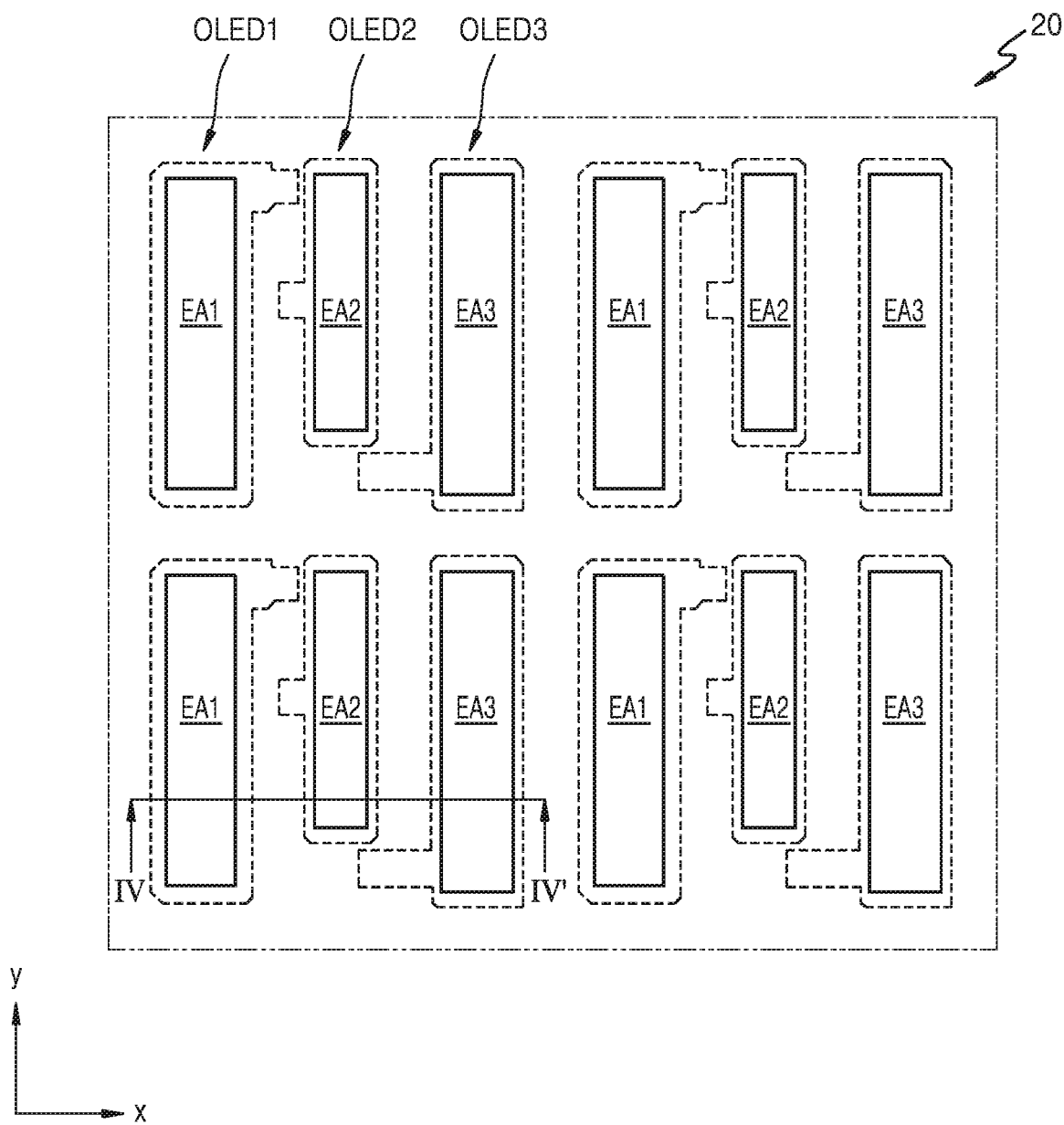
FIG. 4A is a plan view of a display panel according to an exemplary embodiment of the present invention.
Figure 4B:
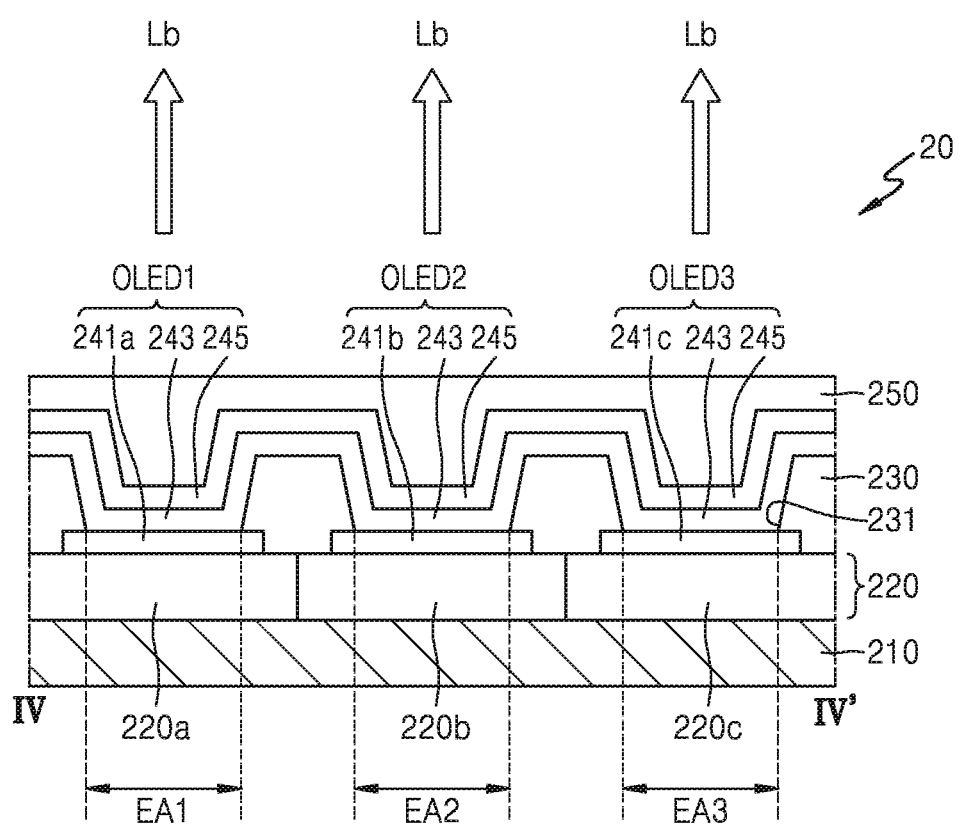
FIG. 4B is a cross-sectional view of a display panel according to an exemplary embodiment of the present invention.

FIG. 4A is a plan view of a display panel according to the embodiment, and FIG. 4B is a cross-sectional view of the display panel taken along line IV-IV' of FIG. 4A. Referring to FIGS. 4A and 4B, the light-emitting panel 20 may include light-emitting elements, e.g., first to third organic light-emitting diodes OLED1, OLED2, and OLED3 in the x-direction and the y-direction.

The first to third organic light-emitting diodes OLED1, OLED2, and OLED3 may respectively correspond to the first to third pixel areas PA1, PA2, and PA3 (see FIG. 1B) described above with reference to FIG. 1B. Referring to FIG. 4B, the light-emitting panel 20 may include a second substrate 210. The second substrate 210 may include a glass material, a metal material, an organic material, etc.

For example, the second substrate 210 may include a glass material mainly containing $SiO_2$, or various flexible or bendable materials, e.g., a polymer resin. A pixel circuit layer 220 may be on the second substrate 210.

The pixel circuit layer 220 may include first to third pixel circuits 220a, 220b, and 220c, and each of the first to third pixel circuits 220a, 220b, and 220c may include a plurality of electronic elements, e.g., transistors and at least one capacitor. The first to third pixel circuits 220a, 220b, and 220c may be electrically connected to the first to third organic light-emitting diodes OLED1, OLED2, and OLED3, respectively. The first organic light-emitting diode OLED1 may include a first pixel electrode 241a, an intermediate layer 243, and an opposite electrode 245 that are sequentially stacked.

The second organic light-emitting diode OLED2 may include a second pixel electrode 241b, the intermediate layer 243, and the opposite electrode 245 that are sequentially stacked, and the third organic light-emitting diode OLED3 may include a third pixel electrode 241c, the intermediate layer 243, and the opposite electrode 245 that are sequentially stacked. The first to third pixel electrodes 241a, 241b, and 241c may be spaced apart from one another. Edges of each of the first to third pixel electrodes 241a, 241b, and 241c may be covered by a sixth insulating layer 230. The sixth insulating layer 230 may include a plurality of openings respectively overlapping or exposing the first to third pixel electrodes 241a, 241b, and 241c, and the first to third pixel electrodes 241a, 241b, and 241c may each overlap the intermediate layer 243 and the opposite electrode 245 thereon via the openings. In this regard, FIG. 4B shows that first openings 231 of the sixth insulating layer 230 respectively overlap or expose the first to third pixel electrodes 241a, 241b, and 241c. The first openings 231 of the sixth insulating layer 230 may respectively define emission areas.

For example, the first openings 231 of the sixth insulating layer 230 respectively define a first emission area EA1, a second emission area EA2, and a third emission area EA3. The intermediate layer 243 includes an emission layer. The emission layer may include an organic material. For example, the emission layer may include a low-molecular weight organic material or a polymer organic material. The emission layer may include a low-molecular weight or polymer organic material emitting blue light.

The intermediate layer 243 may further include one or more functional layers selected from a hole transport layer (HTL), a hole injection layer (HIL), an electron transport layer (ETL), and an electron injection layer (EIL), in addition to the emission layer. The intermediate layer 243, e.g., the emission layer and at least one functional layer, may be integrally provided on the second substrate 210.

The opposite electrode 245 may include a transparent electrode or a semi-transparent electrode. An encapsulation layer 250 may be over (or disposed on) the second substrate 210 to cover the first to third organic light-emitting diodes OLED1, OLED2, and OLED3. The encapsulation layer 250 may include at least one inorganic encapsulation layer and at least one organic encapsulation layer.

In an exemplary embodiment, the encapsulation layer 250 may have a structure, in which a first inorganic encapsulation layer, an organic encapsulation layer, and a second inorganic encapsulation layer are sequentially stacked. The first to third organic light-emitting diodes OLED1, OLED2, and OLED3 may respectively emit the same color light, e.g., blue light Lb.

The blue light Lb emitted from the first to third organic light-emitting diodes OLED1, OLED2, and OLED3 may correspond to the incident light Lib described above with reference to FIG. 2B.

The blue light Lb emitted from the first to third organic light-emitting diodes OLED1, OLED2, and OLED3 may be incident on the color panel 10 as the incident light Lib and pass through the color panel 10 described above. The color panel 10 may convert the incident light Lib to the first color light Lr or the third color light Lg or transmit the incident light Lib as the second color light Lb according to which portion of the color panel 10 the incident light Lib is incident on.

Figure 5:
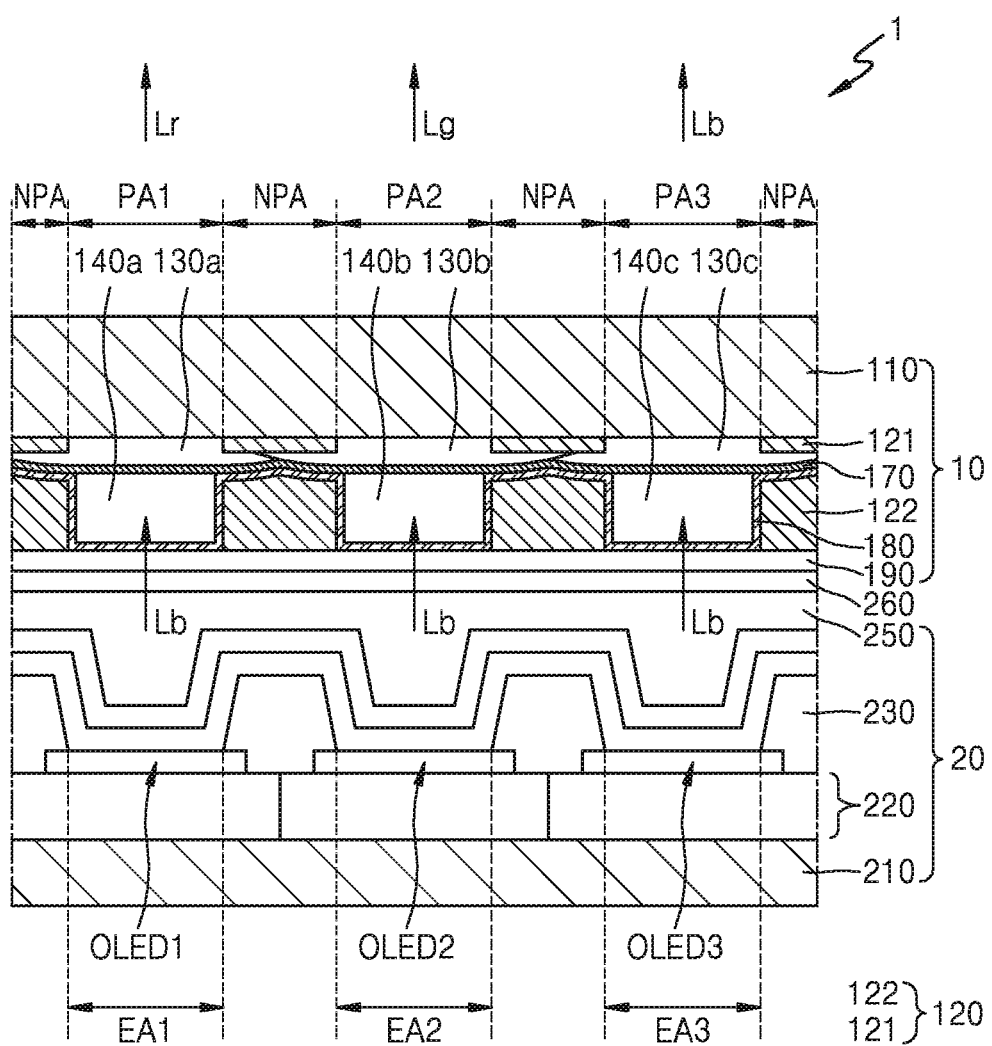
FIG. 5 is a cross-sectional view of a display device according to an exemplary embodiment of the present invention.

FIG. 5 is a cross-sectional view of a display device 1 according to an exemplary embodiment. Referring to FIG. 5, the display device 1 may include the light-emitting panel 20 and the color panel 10 arranged in a light-emitting direction of the light-emitting panel 20, e.g., over the light-emitting panel 20. An intermediate layer 260 may be between the light-emitting panel 20 and the color panel 10.

The intermediate layer 260 may include an organic material.

Detailed examples of the light-emitting panel 20 and the color panel 10 are described above with reference to FIGS. 2A to 4B. The blue light Lb emitted from the first organic light-emitting diode OLED1 of the light-emitting panel 20 is incident on the first color conversion portion 140a of the color panel 10, and may be converted into the red light Lr by the first color conversion portion 140a.

Color purity of the red light Lr may further increase after the red light Lr passes through the first color filter 130a. The blue light Lb emitted from the second organic light-emitting diode OLED2 of the light-emitting panel 20 may sequentially pass through the transmission portion 140b of the color panel 10 and the second color filter 130b. A stack structure of the transmission portion 140b and the second color filter 130b does not include quantum dots, and thus the blue light Lb incident on the stack structure of the transmission portion 140b and the second color filter 130b does not convert into another color.

The blue light Lb passing through the transmission portion 140b and the second color filter 130b is emitted away from the display device 1. The blue light Lb emitted from the third organic light-emitting diode OLED3 of the light-emitting panel 20 is incident on the second color conversion portion 140c of the color panel 10 and may be converted into green light Lg in the second color conversion portion 140c.

Color purity of the green light Lg may further increase after the green light Lb passes through the third color filter 130c. A width of the first emission area EA1 of the light-emitting panel 20 may be equal to, less than, or greater than a width of the first color area of the color panel 10 of FIG. 2B. Here, the width of the first color area may be a width of an area defined by the light-blocking layer 120 and may be substantially equal to a width of the first pixel area PA1. A width of the second emission area EA2 of the light-emitting panel 20 may be equal to, less than, or greater than a width of the second color area of the color panel 10 of FIG. 2B. For example, the width of the second color area may be a width of an area defined by the light-blocking layer 120 and may be substantially equal to a width of the second pixel area PA2. A width of the third emission area EA3 of the light-emitting panel 20 may be equal to, less than, or greater than a width of a third color area of the color panel 10.

For example, the width of the third color area may be a width of an area defined by the light-blocking layer 120 and may be substantially equal to a width of the third pixel area PA3.

Figure 6:
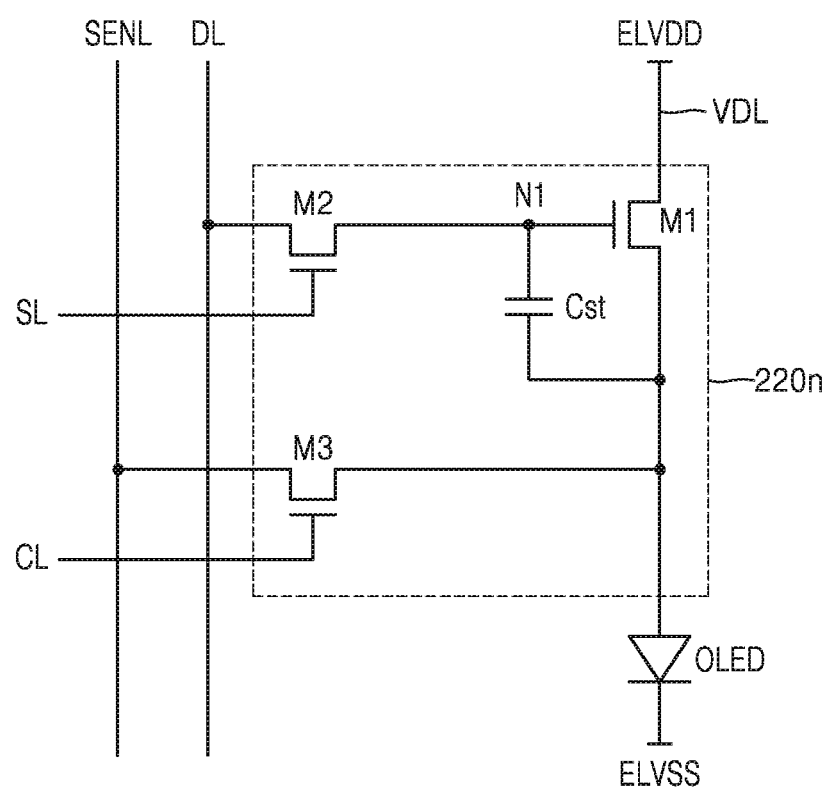
FIG. 6 is a circuit diagram of a pixel circuit connected to a light-emitting diode in a display device according to an exemplary embodiment of the present invention.

FIG. 6 is a circuit diagram of a pixel circuit 220n connected to a light-emitting diode in the display device according to an exemplary embodiment. Referring to FIG. 6, a pixel electrode of an organic light-emitting diode OLED is connected to the pixel circuit 220n and an opposite electrode of the organic light-emitting diode OLED may be connected to a common power voltage ELVSS. The organic light-emitting diode OLED may emit light of a predetermined luminance according to an electric current supplied from the pixel circuit 220n.

The organic light-emitting diode OLED of FIG. 6 may correspond to each of the first to third organic light-emitting diodes OLED1, OLED2, and OLED3 described above with reference to FIG. 5. The pixel circuit 220n may control an amount of the electric current flowing from a power voltage ELVDD to the common power voltage ELVSS via the organic light-emitting diode OLED in response to a data signal.

The pixel circuit 220n may include a driving transistor M1, a switching transistor M2, a sensing transistor M3, and a storage capacitor Cst. Each of the driving transistor M1, the switching transistor M2, and the sensing transistor M3 may be an oxide semiconductor thin film transistor including an active layer including an oxide semiconductor, or a silicon semiconductor thin film transistor including an active layer including polysilicon.

Each of the driving transistor M1, the switching transistor M2, and the sensing transistor M3 may include first and second electrodes which are different from a gate electrode. According to a type of the transistor, the first electrode may be one of a source electrode and a drain electrode and the second electrode may be the other. The first electrode of the driving transistor M1 may be connected to a driving power voltage line VDL that supplies the driving power voltage ELVDD, and the second electrode of the driving transistor M1 may be connected to a pixel electrode of the organic light-emitting diode OLED. A gate electrode of the driving transistor M1 may be connected to a first node N1.

The driving transistor M1 may control an amount of the electric current flowing from the driving power voltage ELVDD to the organic light-emitting diode OLED in response to a voltage of the first node N1. A first electrode of the switching transistor M2 is connected to a data line DL, and a second electrode may be connected to the first node N1. A gate electrode of the switching transistor M2 may be connected to a scan line SL.

The switching transistor M2 is turned on when a scan signal is supplied to the scan line SL to electrically connect the data line DL to the first node N1. A first electrode of the sensing transistor M3 may be connected to the second electrode of the driving transistor M1, and a second electrode of the sensing transistor M3 may be connected to a sensing line SENL. A gate electrode of the sensing transistor M3 may be connected to a control line CL. The sensing transistor M3 is turned on when a control signal is supplied to the control line CL to electrically connect the sensing line SENL to the second electrode of the driving transistor M1.

The sensing transistor M3 may sense characteristic information of the driving transistor M1. The storage capacitor Cst is connected between the first node N1 and the second electrode of the driving transistor M1 to store the voltage of the first node N1.

A first electrode of the storage capacitor Cst may be connected to the gate electrode of the driving transistor M1, and a second electrode of the storage capacitor Cst may be connected to the second electrode of the driving transistor M1. FIG. 6 shows the driving transistor M1, the switching transistor M2, and the sensing transistor M3 as N-type Metal-Oxide-Semiconductor (NMOS) transistors, but one or more exemplary embodiments are not limited thereto.

For example, at least one of the driving transistor M1, the switching transistor M2, and the sensing transistor M3 may be a P-type Metal-Oxide-Semiconductor (PMOS) transistor. FIG. 6 shows that the pixel circuit 220n includes three transistors, but one or more exemplary embodiments are not limited thereto.

For example, the pixel circuit 220n may include four or more transistors.

Figure 7:
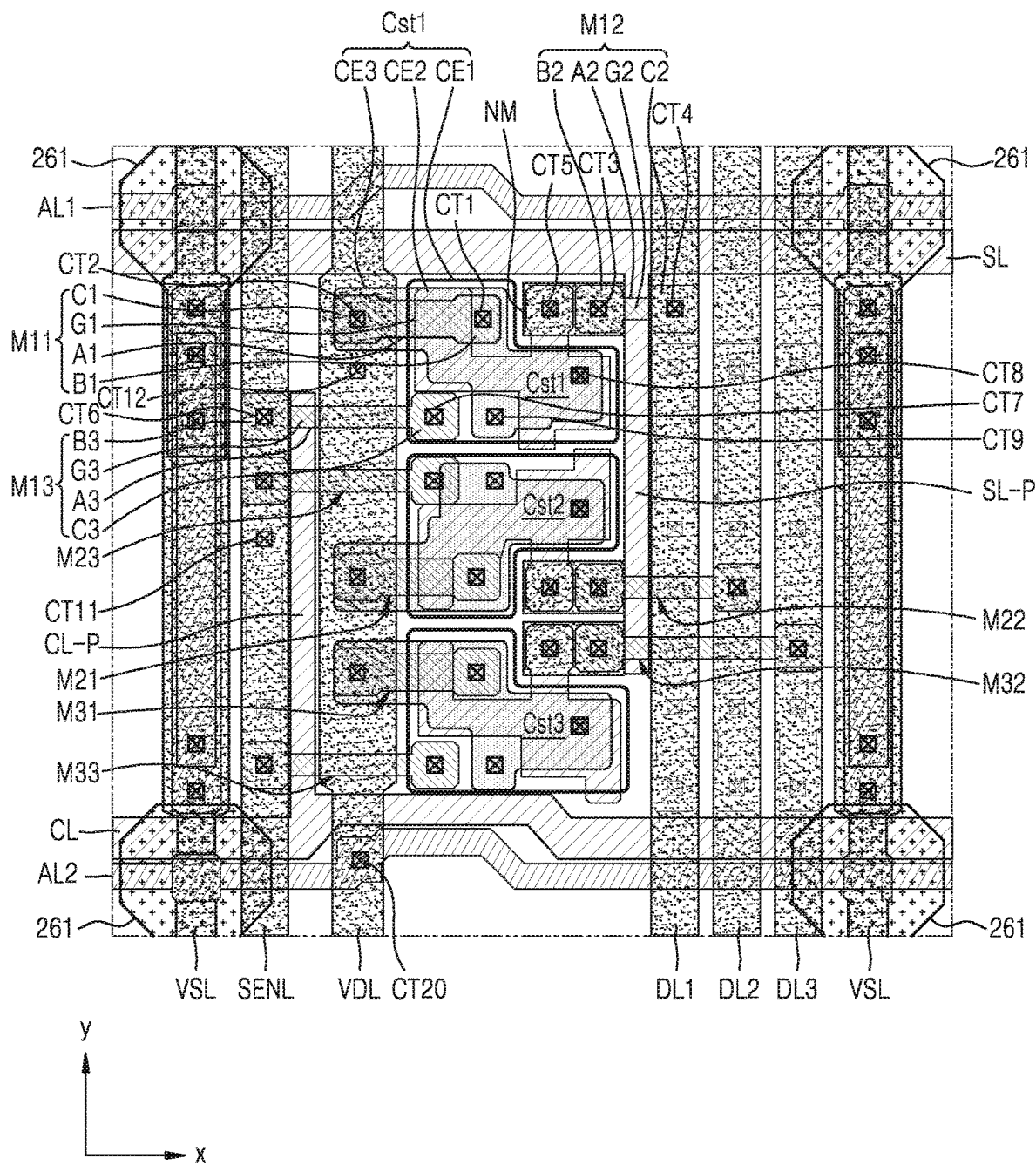
FIG. 7 is a plan view of a pixel circuit and lines on a light-emitting panel in a display device according to an exemplary embodiment of the present invention.
Figure 8:
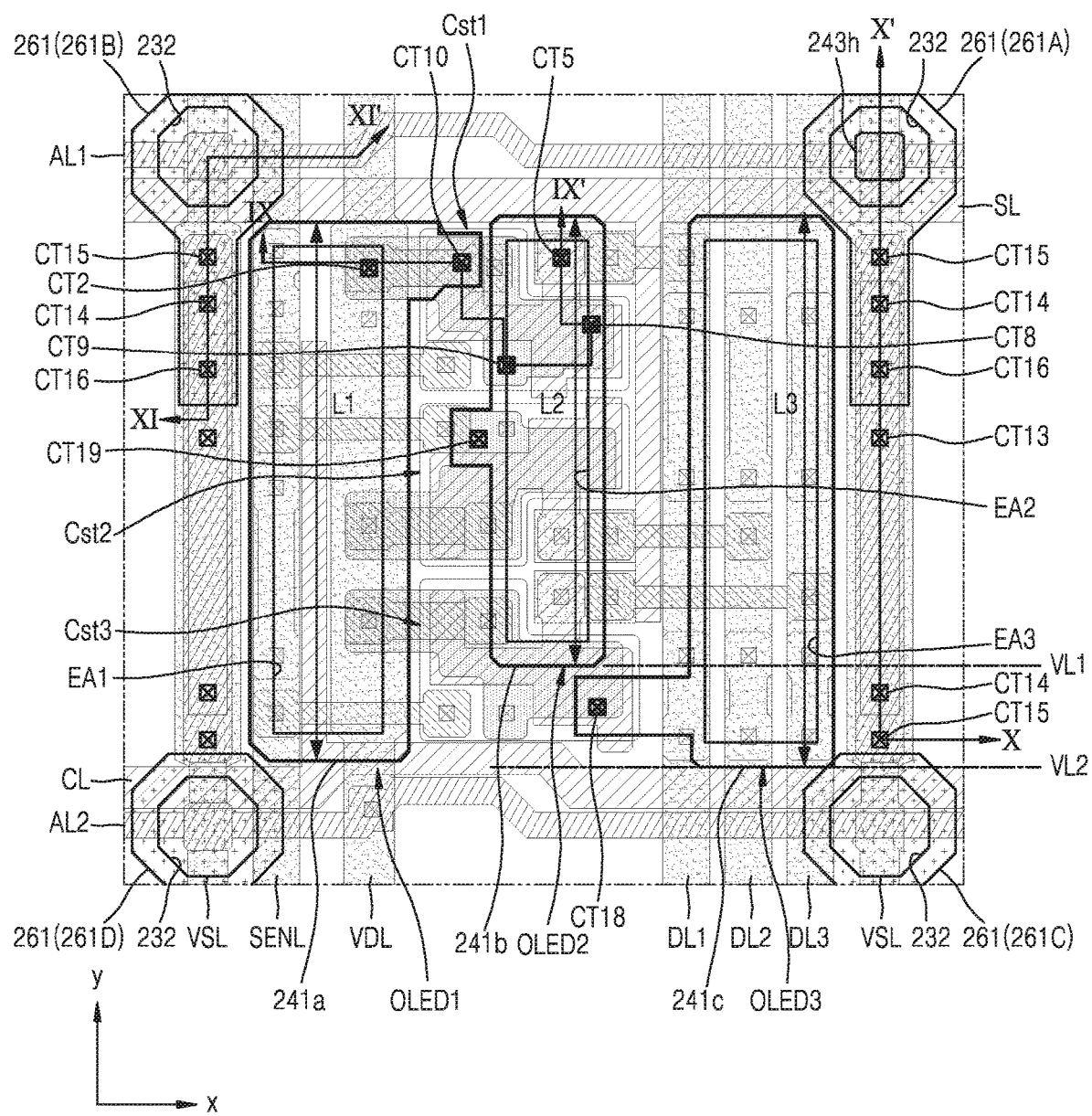
FIG. 8 is a plan view of organic light-emitting diodes overlapping the pixel circuit and lines of FIG. 7 according to an exemplary embodiment of the present invention.
Figure 9:
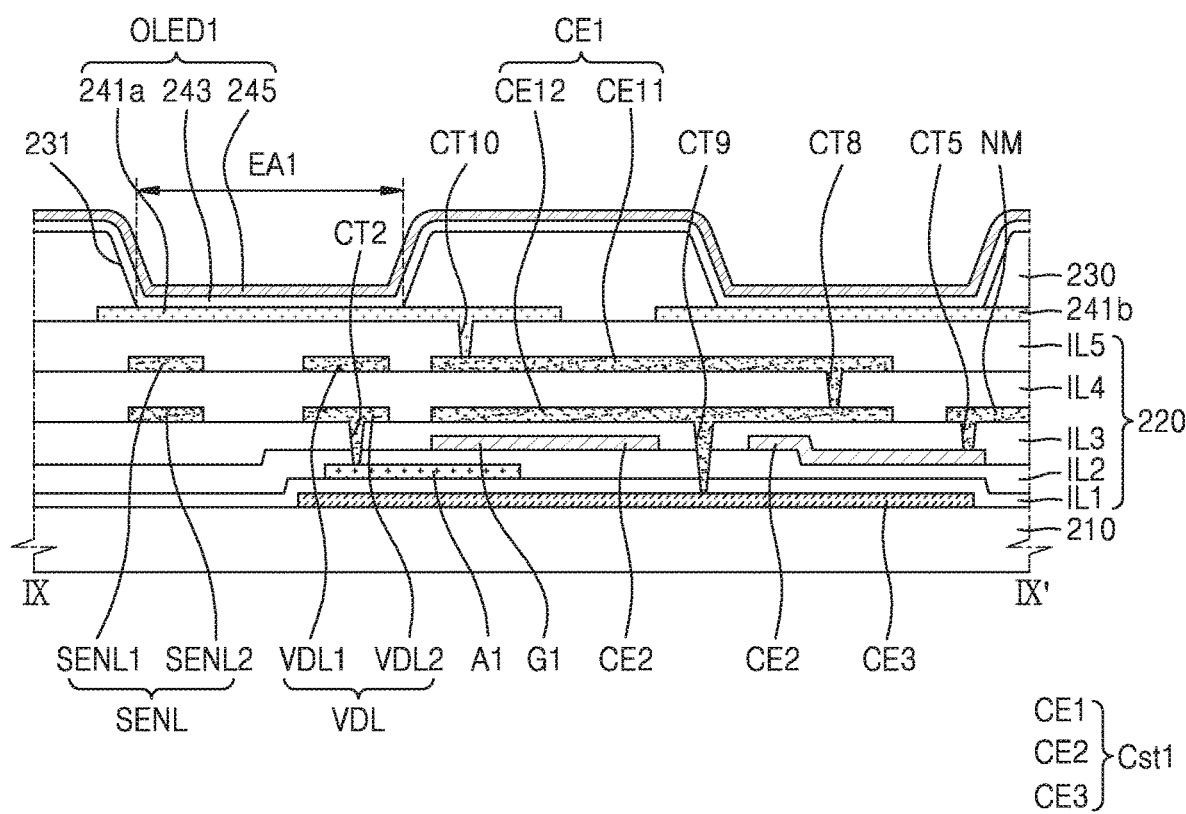
FIG. 9 is a cross-sectional view taken along line Ix-IX' of FIG. 8 according to an exemplary embodiment of the present invention.

FIG. 7 is a plan view of a pixel circuit, power lines and signal lines on a light-emitting panel of a display device according to an exemplary embodiment, FIG. 8 is a plan view of organic light-emitting diodes overlapping the pixel circuit, power lines and signal lines of FIG. 7, and FIG. 9 is a cross-sectional view taken along line IX-IX' of FIG. 8. Referring to FIG. 7, first power lines (hereinafter, referred to as common power voltage lines VSL) may extend in a first direction (e.g., ±y direction). The common power voltage lines VSL may be spaced apart from each other in a second direction (e.g., ±x-direction) intersecting with the first direction. A plurality of data lines, e.g., first to third data lines DL1, DL2, and DL3, a second power line (hereinafter, referred to as a driving power voltage line VDL), and the sensing line SENL may be between neighboring common power voltage lines VSL. The first to third data lines DL1, DL2, and DL3, the driving power voltage line VDL, and the sensing line SENL may extend in the first direction.

The first to third data lines DL1, DL2, and DL3 may be spaced apart from one another in the second direction and may be adjacent to one of the two common power voltage lines VSL, between the two common power voltage lines VSL. One or more auxiliary lines may be provided in a direction intersecting with the common power voltage lines VSL and the driving power voltage line VDL, e.g., in the second direction (±x-direction). In an exemplary embodiment, FIG. 7 shows a first auxiliary line AL1 and a second auxiliary line AL2. The first auxiliary line AL1 and second auxiliary line AL2 may be spaced apart from each other. For example, the first auxiliary line AL1 may be adjacent to the scan line SL and the second auxiliary line AL2 may be adjacent to the control line CL. One of the first auxiliary line AL1 and the second auxiliary line AL2 may be electrically connected to the common power voltage line VSL, and the other may be electrically connected to the driving power voltage line VDL. Since the first auxiliary line AL1 and/or the second auxiliary line AL2 are electrically connected to the common power voltage line VSL or the driving power voltage line VDL, a line applying the common power voltage ELVSS or the driving power voltage ELVDD may have a mesh structure having a grating shape. The mesh structure may prevent drop of the voltage applied via the common power voltage line VSL or the driving power voltage line VDL. In an exemplary embodiment, FIG. 7 shows a structure in which the first auxiliary line AL1 is electrically connected to the common power voltage line VSL and the second auxiliary line AL2 is electrically connected to the driving power voltage line VDL.

For example, the second auxiliary line AL2 may be electrically connected to the driving power voltage line VDL via a twentieth contact hole CT20 and an electrical connection between the first auxiliary line AL1 and the common power voltage line VSL will be described below with reference to FIG. 10.

Each of the scan line SL and the control line CL may extend in the second direction (±x-direction) intersecting with the first direction, and a plurality of electronic elements, e.g., transistors and storage capacitors, may be between the scan line SL and the control line CL. As shown in FIGS. 7 and 8, a plurality of pixel electrodes, e.g., the first pixel electrode 241a, the second pixel electrode 241b, and the third pixel electrode 241c, may be between the neighboring common power voltage lines VSL. The first to third pixel electrodes 241a, 241b, and 241c may respectively correspond to different pixel areas.

The first pixel electrode 241a may be the pixel electrode of the first organic light-emitting diode OLED1, the second pixel electrode 241b may be the pixel electrode of the second organic light-emitting diode OLED2, and the third pixel electrode 241c may be the pixel electrode of the third organic light-emitting diode OLED3.

The first pixel electrode 241a may be connected to the pixel circuit. In this regard, FIGS. 7 and 8 show that the first pixel electrode 241a is electrically connected to a first driving transistor M11, a second switching transistor M12, a first sensing transistor M13, and a first storage capacitor Cst1. The first driving transistor M11 may include a first active layer A1 and a first gate electrode G1. The first active layer A1 may include a first high-concentration impurity region B1 and a second high-concentration impurity region C1, and a first channel region may be between the first high-concentration impurity region B1 and the second high-concentration impurity region C1. The first high-concentration impurity region B1 and the second high-concentration impurity region C1 may be doped with impurities of higher concentration than that of the first channel region.

The first gate electrode G1 may overlap the first channel region of the first active layer A1. One of the first high-concentration impurity region B1 and the second high-concentration impurity region C1 of the first active layer A1 may be connected to the driving power voltage line VDL and the other may be connected to the first storage capacitor Cst1. For example, the first high-concentration impurity region B1 may be connected to a first electrode CE1 of the first storage capacitor Cst1 via a first contact hole CT1 and the second high-concentration impurity region C1 may be connected to the driving power voltage line VDL via a second contact hole CT2.

A part of the first electrode of the first storage capacitor Cst1, which is connected to the first high-concentration impurity region B1, and a part of the driving power voltage line VDL, which is connected to the second high-concentration impurity region C1, may respectively correspond to the second electrode and the first electrode of the driving transistor M1 described above with reference to FIG. 6. The first switching transistor M12 may include a second active layer A2 and a second gate electrode G2. The second active layer A2 may include a first high-concentration impurity region B2 and a second high-concentration impurity region C2, and a second channel region may be between the first high-concentration impurity region B2 and the second high-concentration impurity region C2. The second gate electrode G2 may overlap the second channel region of the second active layer A2.

The second gate electrode G2 may be a part of the scan line SL. The scan line SL extending in the second direction (±x-direction) may include a first extension portion SL-P extending from a side of the scan line SL in the first direction (±y-direction), and a part of the first extension portion SL-P may correspond to the second gate electrode G2.

The first extension portion SL-P may be adjacent to a first data line DL1. One of the first high-concentration impurity region B2 and the second high-concentration impurity region C2 of the second active layer A2 may be connected to the first data line DL and the other may be connected to the first storage capacitor Cst1 via a connection metal NM.

For example, the first high-concentration impurity region B2 may be connected to the connection metal NM via a third contact hole CT3 and the second high-concentration impurity region C2 may be connected to the first data line DL1 via a fourth contact hole CT4. The first sensing transistor M13 may include a third active layer A3 and a third gate electrode G3. The third active layer A3 may include a first high-concentration impurity region B3 and a second high-concentration impurity region C3, and a third channel region may be between the first high-concentration impurity region B3 and the second high-concentration impurity region C3.

The third gate electrode G3 may overlap the third channel region of the third active layer A3. The third gate electrode G3 may be a part of the control line CL. The control line CL extending in the second direction (±x-direction) may include a second extension portion CL-P extending from a side of the control line CL in the first direction (±y-direction), and a part of the second extension portion CL-P may be the third gate electrode G3.

The second extension portion CL-P may extend between the sensing line SENL and the driving power voltage line VDL. One of the first high-concentration impurity region B3 and the second high-concentration impurity region C3 of the third active layer A3 may be connected to the sensing line SENL and the other may be connected to the first storage capacitor Cst1.

For example, the first high-concentration impurity region B3 may be connected to the sensing line SENL via a sixth contact hole CT6 and the second high-concentration impurity region C3 may be electrically connected to the first electrode of the first storage capacitor Cst1 via a seventh contact hole CT7. The first storage capacitor Cst1 may include at least two electrodes. In an exemplary embodiment, FIG. 7 shows that the first storage capacitor Cst1 includes a first electrode CE1, a second electrode CE2, and a third electrode CE3. The first to third electrodes CE1, CE2, and CE3 may overlap one another. The first storage capacitor Cst1 (e.g., the first electrode CE1, the second electrode CE2, and the third electrode CE3) may be between the driving power voltage line VDL and the first data line DL1 in a plan view.

The first electrode CE1, the second electrode CE2, and the third electrode CE3 may be respectively connected to different elements from one another. Referring to FIG. 9, the first electrode CE1, the second electrode CE2, and the third electrode CE3 may be disposed over a second substrate 210.

The first electrode CE1 may be disposed over the second electrode CE2, and the second electrode CE2 may be disposed over the third electrode CE3. The third electrode CE3 may be directly on an upper surface of the second substrate 210. The third electrode CE3 may include metal, e.g., molybdenum (Mo), copper (Cu), aluminum (Al), titanium (Ti), etc., and may have a single-layered or multi-layered structure including the above stated material. A portion of the third electrode CE3 may be directly under the first active layer A1 of the first driving transistor M11 to overlap the first active layer A1.

A first insulating layer IL1 may be disposed on the third electrode CE3. The first insulating layer IL1 may include an inorganic insulating material such as silicon nitride, silicon oxide, and/or silicon oxynitride. The first active layer A1 may be on the first insulating layer IL1. FIG. 9 shows that the first active layer A1, but the second active layer A2 and the third active layer A3 described above with reference to FIG. 7 may be on the first insulating layer IL1 like the first active layer A1. A second insulating layer IL2 may be on the first active layer A1. The second insulating layer IL2 may include an inorganic insulating material such as silicon nitride, silicon oxide, and/or silicon oxynitride. In an exemplary embodiment, the first active layer A1 may be interposed between a portion of the first insulating layer IL1 and a portion of the second insulating layer IL2.

The second electrode CE2 may be on the second insulating layer IL2. The second electrode CE2 may include metal, e.g., molybdenum (Mo), copper (Cu), aluminum (Al), titanium (Ti), etc., and may have a single-layered or multi-layered structure including the above stated material. A first portion of the second electrode CE2 may correspond to the first gate electrode G1 as described above. A second portion of the second electrode CE2 may be connected to the connection metal NM via a fifth contact hole CT5 in a third insulating layer IL3. The second electrode CE2 may be covered by the third insulating layer IL3. The third insulating layer IL3 may include an inorganic insulating material such as silicon nitride, silicon oxide, or silicon oxynitride.

The first electrode CE1 may be disposed on the third insulating layer IL3. In an exemplary embodiment, the first electrode CE1 may include a multi-electrode including a plurality of sub-layers that are on and under an insulating layer and connected to each other via a contact hole in the insulating layer. For example, FIG. 9 illustrates that the first electrode CE1 includes a first sub-layer CE11 and a second sub-layer CE12 respectively on and under a fourth insulating layer IL4. The first sub-layer CE11 and the second sub-layer CE12 may include metal, e.g., molybdenum (Mo), copper (Cu), aluminum (Al), titanium (Ti), etc., and may have a single-layered or multi-layered structure including the above stated material. The first sub-layer CE11 and the second sub-layer CE12 may be connected to each other via an eighth contact hole CT8 in the fourth insulating layer IL4. In an exemplary embodiment, the first electrode CE1 may include one of the first sub-layer CE11 and the second sub-layer CE12. For example, the first electrode CE1 may be formed of the first sub-layer CE11 only or the second sub-layer CE12 only.

The first electrode CE1 may have the same voltage level as that of the third electrode CE3. For example, the first electrode CE1 may be connected to the third electrode CE3 via a contact hole that penetrates through at least one insulating layer between the first electrode CE1 and the third electrode CE3. For example, FIG. 9 shows that the first electrode CE1 is connected to the third electrode CE3 via a ninth contact hole CT9 that penetrates through the first to third insulating layers IL1, IL2, and IL3.

Since a capacitance of the first storage capacitor Cst1 is based on a sum of a capacitance between the first electrode CE1 and the second electrode CE2 and a capacitance between the second electrode CE2 and the third electrode CE3, the capacitance of the first storage capacitor Cst1 may increase as compared with a case in which two electrodes are provided.

The driving power voltage line VDL may have a dual-line structure. The driving power voltage line VDL may include a first sub-driving power voltage line VDL1 and a second sub-driving power voltage line VDL2 on and under the fourth insulating layer IL4, respectively. The first sub-driving power voltage line VDL1 may be connected to the second sub-driving power voltage line VDL2 via a twelfth contact hole CT12 (see FIG. 7) that penetrate through the fourth insulating layer IL4. The fourth insulating layer IL4 may include an inorganic insulating material and/or an organic insulating material.

Similarly, the sensing line SENL may have a dual-line structure. The sensing line SENL may include a first sub-sensing line SENL1 and a second sub-sensing line SENL2 on and under the fourth insulating layer IL4, respectively. The first sub-sensing line SENL1 and the second sub-sensing line SENL2 may be connected to each other via an eleventh contact hole CT11 (see FIG. 7) that penetrates through the fourth insulating layer IL4.

Although not shown in FIG. 9, each of the first to third data lines DL1, DL2, and DL3 described above with reference to FIG. 7 may have a dual-line structure, in which dual lines are connected to each other via a contact hole in the fourth insulating layer IL4.

A fifth insulating layer IL5 may be disposed on the first electrode CE1, the driving power voltage line VDL, and the sensing line SENL that are on the same layer (e.g., the third insulating layer IL3). The fifth insulating layer IL5 may include an inorganic insulating material and/or an organic insulating material. The organic insulating material may include an organic material such as acryl, benzocyclobutene (BCB), polyimide, (hexamethyldisiloxane (HMDSO), etc.

The first pixel electrode 241a may be on the fifth insulating layer IL5 and may be electrically connected to an electronic element, e.g., the first storage capacitor Cst1, of the pixel circuit via the twelfth contact hole CT12 in the fifth insulating layer IL5. FIG. 9 illustrates that the first pixel electrode 241a is connected to a part of an electronic element, e.g., the first electrode CE1 of the first storage capacitor Cst1. Similarly, the second pixel electrode 241b is also on the fifth insulating layer IL5, and although not shown in FIG. 9, the third pixel electrode 241c (see FIG. 8) may be on the fifth insulating layer IL5.

The sixth insulating layer 230 is disposed on the first pixel electrode 241a and may include a first opening 231 exposing the first pixel electrode 241a. The intermediate layer 243 and the opposite electrode 245 may be on the first pixel electrode 241a that is exposed through the first opening 231. The first pixel electrode 241a, the intermediate layer 243, and the opposite electrode 245 that are sequentially stacked may form the first organic light-emitting diode OLED1. The first opening 231 of the sixth insulating layer 230 may define the first light-emitting area EA1 of the first organic light-emitting diode OLED1.

Structures of the first organic light-emitting diode OLED1 and the pixel circuit connected to the first organic light-emitting diode OLED1 described above with reference to FIGS. 7 to 9 may also be applied to the second and third organic light-emitting diodes OLED2 and OLED3 and pixel circuits connected to the second and third organic light-emitting diodes OLED2 and OLED3. Referring to FIGS. 7 and 8, the second pixel electrode 241b of the second organic light-emitting diode OLED2 may be electrically connected to a second driving transistor M21, a second switching transistor M22, a second sensing transistor M23, and a second storage capacitor Cst2. Similarly, the third pixel electrode 241c of the third organic light-emitting diode OLED3 may be electrically connected to a third driving transistor M31, a third switching transistor M32, a sensing transistor M33, and a third storage capacitor Cst3.

Structures of the second driving transistor M21, the second switching transistor M22, the second sensing transistor M23, and the second storage capacitor Cst2 are similar to those of the first driving transistor M11, the first switching transistor M12, the first sensing transistor M13, and the first storage capacitor Cst1, and thus descriptions thereof are omitted. Structures of the third driving transistor M31, the third switching transistor M32, the third sensing transistor M33, and the third storage capacitor Cst3 are similar to those of the first driving transistor M11, the first switching transistor M12, the first sensing transistor M13, and the first storage capacitor Cst1, and thus descriptions thereof are omitted.

Like the first storage capacitor Cst1 and the first pixel electrode 241a being connected to each other via a tenth contact hole CT10 defined in the fifth insulating layer IL5 (see FIG. 9), the second storage capacitor Cst2 and the second pixel electrode 241b may be connected to each other via a nineteenth contact hole CT19 defined in the fifth insulating layer IL5. The third storage capacitor Cst3 and the third pixel electrode 241c may be connected to each other via an eighteenth contact hole CT18 defined in the fifth insulating layer. The tenth contact hole CT10 corresponds to a connection point (first connection point) between the first storage capacitor Cst1 and the first pixel electrode 241a, the nineteenth contact hole CT19 corresponds to a connection point (second connection point) between the second storage capacitor Cst2 and the second pixel electrode 241b, and the eighteenth contact hole CT18 corresponds to a connection point between the third storage capacitor Cst3 and the third pixel electrode 241c.

The first to third storage capacitors Cst1, Cst2, and Cst3 are located between two neighboring common power voltage lines VSL and may be arranged in one direction (a direction in which the common power voltage lines extend, e.g., y-direction).

The second pixel electrode 241b overlaps some parts of the first to third storage capacitors Cst1, Cst2, and Cst3, and thus may have a length (a length in the first direction, L2) that is relatively less than those of the other pixel electrodes for the connection between one of the first and third storage capacitors Cst1 and Cst3 and the pixel electrode electrically connected thereto. For example, the length L2 of the second pixel electrode 241b in the first direction may be less than lengths L1 and L3 of the first and third pixel electrodes 241a and 241c in the first direction. The present inventive concept is not limited thereto. In an exemplary embodiment, one of the first to third pixel electrodes 241a, 241b and 241c may have a length smaller than another one of the first to third pixel electrodes 241a, 241b and 241c. The eighteenth contact hole CT18, that is, the connection point between the third storage capacitor Cst3 and the third pixel electrode 241c, may be located between a first virtual line VL1 passing through one side edge of the second pixel electrode 241b and a second virtual line VL2 passing through one side edge of the third pixel electrode 241c.

Figure 10:
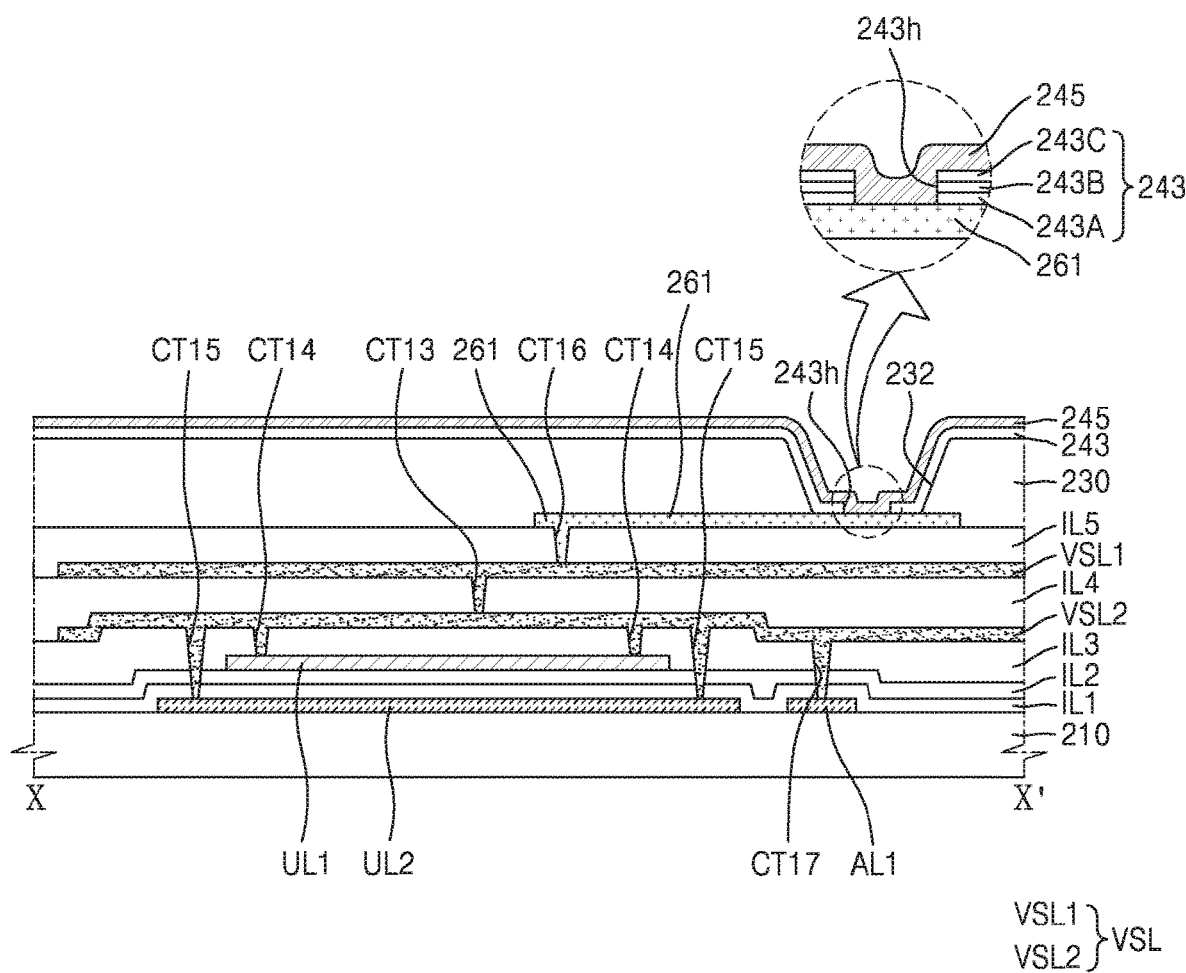
FIG. 10 is a cross-sectional view taken along line x-X' of FIG. 8 according to an exemplary embodiment of the present invention.
Figure 11:
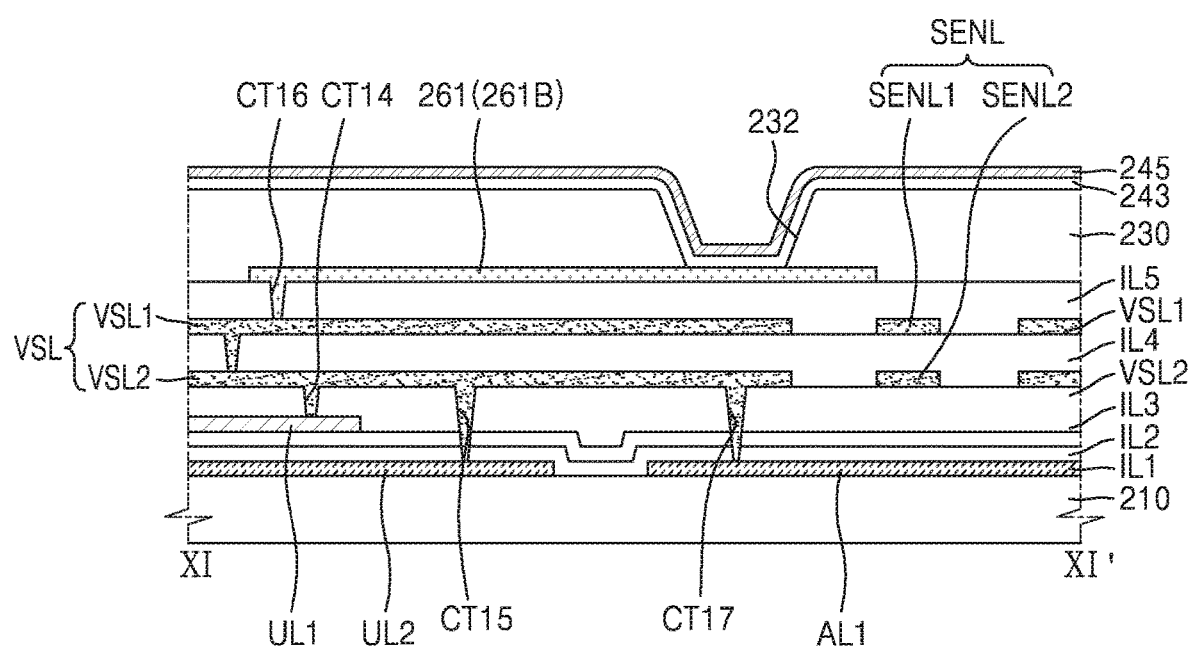
FIG. 11 is a cross-sectional view taken along line XI-XI' of FIG. 8 according to an exemplary embodiment of the present invention.

FIG. 10 is a cross-sectional view taken along line X-X' of FIG. 8, and FIG. 11 is a cross-sectional view taken along line XI-XI' of FIG. 8.

Referring to FIG. 10, the common power voltage line VSL may have a dual-line structure. For example, the common power voltage line VSL may include a first sub-common power voltage line VSL1 and a second sub-common power voltage line VSL2 overlapping each other with the fourth insulating layer IL4 therebetween, similarly to the driving power voltage line VDL (see FIG. 9) and the sensing line SENL (see FIG. 9) described above with reference to FIGS. 8 and 9. The first sub-common power voltage line VSL1 and the second sub-common power voltage line VSL2 may be electrically connected to each other via a thirteenth contact hole CT13 that penetrates the fourth insulating layer IL4.

At least one under line (e.g., a signal line) may be disposed under the common power voltage line VSL. In an exemplary embodiment, FIG. 10 shows that a first under line UL1 and a second under line UL2 are under the common power voltage line VSL.

The first under line UL1 may be disposed on the same layer (e.g., the second insulating layer IL2) as that of the scan line SL (see FIG. 7) and the control line CL (see FIG. 7) and may include the same material as those of the scan line SL and the control line CL. The second under line UL2 is disposed on the same layer (e.g., the second substrate 210) as that of the third electrode CE3 of the first storage capacitor Cst1 (see FIG. 7), and the first and second auxiliary lines AL1 and AL2, and may include the same material as those of the third electrode CE3 and the first and second auxiliary lines AL1 and AL2. FIG. 10 shows that the first auxiliary line AL1 is disposed on the same layer as that of the second under line UL2. As described above with reference to FIGS. 8 and 9, the first auxiliary line AL1 may be electrically connected to the common power voltage line VSL or the driving power voltage line VDL, and in an exemplary embodiment, FIG. 10 shows that the first auxiliary line AL1 and the common power voltage line VSL are electrically connected to each other via a seventeenth contact hole CT17.

The common power voltage line VSL may be connected to the first under line UL1 via a fourteenth contact hole CT14 and may be connected to the second under line UL2 via a fifteenth contact hole CT15. The first and second under lines UL1 and UL2 may have the same voltage level as that of the common power voltage line VSL. The first and second under lines UL1 and UL2 may have lengths that are less than that of the common power voltage line VSL and may be electrically connected to the common power voltage line VSL and may overlap the common power voltage line VSL. When the display device is a large-sized display device, there may be a voltage drop issue due to a resistance of the common power voltage line VSL itself. However, as described above, when the common power voltage line VSL has a dual-line structure and/or is connected to the first and second under lines UL1 and UL2, the voltage drop caused due to the resistance of the common power voltage line VSL itself may be effectively prevented.

The common power voltage line VSL may be electrically connected to a connecting electrode 261 that is disposed on the fifth insulating layer IL5. The connecting electrode 261 is disposed on the same layer (e.g., the fifth insulating layer IL5) as that of the first pixel electrode 241*a* (see FIG. 9) and may include the same material as the first pixel electrode 241*a*. The connecting electrode 261 may be connected to the common power voltage line VSL via a sixteenth contact hole CT16 that penetrates the fifth insulating layer IL5.

The sixth insulating layer 230 may be disposed on the connecting electrode 261. The sixth insulating layer 230 may include a second opening 232 that overlaps the connecting electrode 261. The second opening 232 is distinguished from the first opening 231 described above with reference to FIG. 9. The first opening 231 described above with reference to FIG. 9 exposes the electronic element of the pixel circuit, e.g., the first pixel electrode 241 connected to the first storage capacitor Cst1. However, the second opening 232 exposes the connecting electrode 261 that is connected to the common power voltage line VSL and may be provided for electrical connection between the opposite electrode 245 and the connecting electrode 261.

The intermediate layer 243 may be disposed on the sixth insulating layer 230 and may include a through hole 243*h* within the second opening 232. As shown in the enlarged view of FIG. 10, the intermediate layer 243 may include a first functional layer 243A, an emission layer 243B, and a second functional layer 243C. In this case, the through hole 243*h* may penetrate through the first functional layer 243A, the emission layer 243B, and the second functional layer 243C and may be manufactured by a laser drilling process. The opposite electrode 245 on the intermediate layer 243 may be in direct contact with the connecting electrode 261 via the through hole 243*h*. The first functional layer 243A may include a hole injection layer and/or a hole transport layer, and the second functional layer 243C may include an electron injection layer and/or an electron transport layer.

The opposite electrode 245 has a relatively large area so as to entirely cover the display area. A region of the opposite electrode 245 may have a resistance which is different from that of another region of the opposite electrode 245 due to a voltage drop of the opposite electrode 245 itself. However, since the common power voltage line VSL passing through the display area is electrically connected to the opposite electrode 245 as in one or more exemplary embodiments, the voltage drop due to the resistance of the opposite electrode 245 itself may be prevented.

The connecting electrode 261 may overlap the common power voltage line VSL and may be spaced apart from neighboring connecting electrodes 261. For example, as shown in FIG. 8, one connecting electrode (hereinafter, referred to as a first connecting electrode 261A) may be spaced apart from one another connecting electrode (hereinafter, referred to as a second connecting electrode 261B) in the second direction, and may also be spaced apart from the other connecting electrode (hereinafter, referred to as a third connecting electrode 261C) in the first direction. Other connecting electrode (hereinafter, referred to as a fourth connecting electrode 261D) may be apart from the second connecting electrode 261B and the third connecting electrode 261C respectively in the first and second directions.

Edges of the first to fourth connecting electrodes 261A, 261B, 261C, and 261D are covered by the sixth insulating layer 230 (see FIG. 10). The sixth insulating layer 230 may include the second openings 232 that respectively overlap the first to fourth connecting electrodes 261A, 261B, 261C, and 261D. For example, the second openings 232 may be provided to overlap the first to fourth connecting electrodes 261A, 261B, 261C, and 261D, respectively. In other words, the second openings 232 may be located to overlap the first to fourth connecting electrodes 261A, 261B, 261C, and 261D, respectively.

The second openings 232 may expose the connecting electrodes, e.g., first to fourth connecting electrodes 261A, 261B, 261C, and 261D. However, not all the second openings 232 are used for the electrical connection between the opposite electrode 245 and the common power voltage line VSL as shown in FIG. 10.

Referring to FIG. 11, the common power voltage line VSL may be connected to the first and second under lines UL1 and UL2 as described above with reference to FIG. 10, and may be electrically connected to the connecting electrode 261, e.g., the second connecting electrode 261B, via the sixteenth contact hole CT16 in the fifth insulating layer IL5. The second connecting electrode 261B is covered by the sixth insulating layer 230 and the second opening 232 may expose the second connecting electrode 261B. The intermediate layer 243 and the opposite electrode 245 may be sequentially stacked in the second opening 232 without a through hole penetrating through the intermediate layer 243, and thus, the opposite electrode 245 may not be in contact with the second connecting electrode 261B. In an exemplary embodiment, when the intermediate layer 243 includes a through hole that exposes the second connecting electrode 261B and is formed within the second opening 232 through a laser drilling process, etc., the opposite electrode 245 may be in contact with the second connecting electrode 261B via the through hole and this structure may be the same as the structure described above with reference to FIG. 10.

Referring to FIGS. 8, 10, and 11, the first to third organic light-emitting diodes OLED1, OLED2, and OLED3 that are spaced apart from one another are disposed between two common power voltage lines VSL, and the connecting electrodes 261, e.g., the first to fourth connecting electrodes 261A, 261B, 261C, and 261D may each overlap the two common power voltage lines VSL.

The sixth insulating layer 230 may include the second openings 232 that respectively overlap the first to fourth connecting electrodes 261A, 261B, 261C, and 261D. The second openings 232 are provided for the electrical connection between the opposite electrode 245 and the connecting electrode 261, but the electrical connection between the opposite electrode 245 and the common power voltage line VSL via the second opening 232 may be selectively made according to whether the laser drilling process is performed. As described above with reference to FIGS. 8 to 10, and 11, the opposite electrode 245 and the common power voltage line VSL are electrically connected to each other via the second opening 232 that exposes the first connecting electrode 261A from among the first to fourth connecting electrodes 261A, 261B, 261C, and 261D.

In an exemplary embodiment, the opposite electrode 245 and the common power voltage line VSL may be electrically connected to each other via one, two, or more second openings 232, from among the plurality of second openings 232 exposing the first to fourth connecting electrodes 261A, 261B, 261C, and 261D.

In FIGS. 8 to 10, the first and second auxiliary lines AL1 and AL2 are disposed on the same layer as that of the third electrode CE3 and include the same material as that of the third electrode CE3, but one or more exemplary embodiments are not limited thereto. In an exemplary embodiment, the first and second auxiliary lines AL1 and AL2 may be disposed on the same layer (e.g., the fifth insulating layer IL5) as those of the first to third pixel electrodes 241a, 241b, and 241c, and may include the same material as those of the first to third pixel electrodes 241a, 241b, and 241c. Such arrangement may allow effective use of a space under the first and second auxiliary lines AL1 and AL2. For example, sizes or stack structure of lines, transistors, or storage capacitor between the second substrate 210 and the first and second auxiliary lines AL1 and AL2 may be changed. In an exemplary embodiment, an area of the storage capacitor may be relatively greater than that of FIG. 8 or the scan line SL or the control line CL is configured to have dual or triple line structure, and thus the resistance of scan line SL or the control line CL may be reduced.

Figure 12:
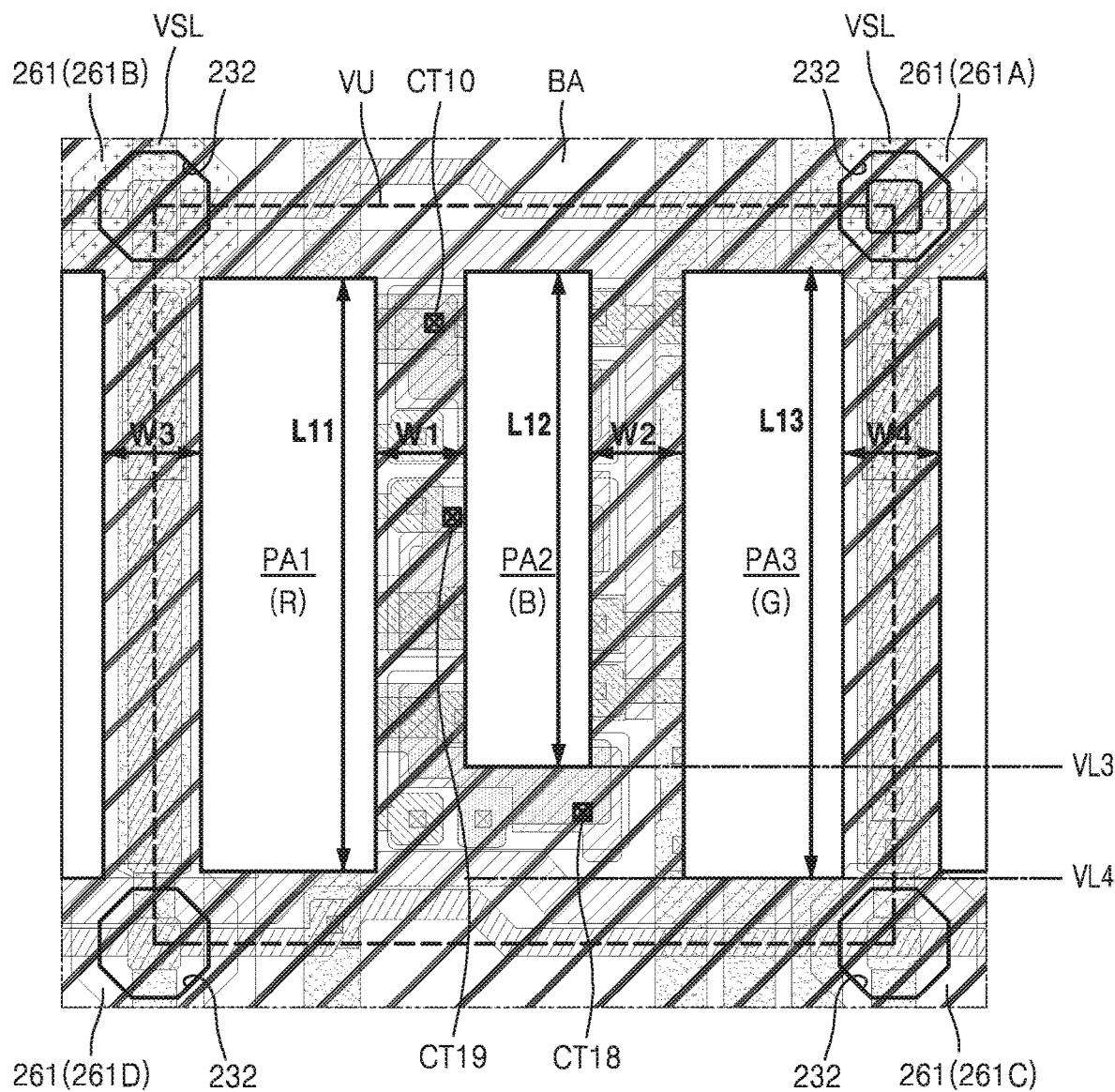
FIG. 12 is a plan view partially showing a display device according to an exemplary embodiment of the present invention.

FIG. 12 is a plan view partially showing a display device according to an exemplary embodiment. FIG. 12 shows a state in which a color panel overlaps the light-emitting panel of FIG. 8.

Referring to FIG. 12, the connecting electrodes 261 overlap two common power voltage lines VSL that are spaced apart from each other as described above with reference to FIG. 8. For example, the two common power voltage lines VSL extending in the first direction are spaced apart from each other in the second direction, and the first to fourth connecting electrodes 261A, 261B, 261C, and 261D may be spaced apart from one another while overlapping one of the two common power voltage lines VSL. The first connecting electrode 261A and the third connecting electrode 261C are spaced apart from each other in the first direction while overlapping the same common power voltage line VSL (e.g., the common power voltage line at a right side), and the second connecting electrode 261B and the fourth connecting electrode 261D may be spaced apart from each other in the first direction while overlapping the same common power voltage line VSL (the common power voltage line at a left side).

The second openings 232 may be provided to overlap each of the first to fourth connecting electrodes 261A, 261B, 261C, and 261D. A first pixel area PA1, a second pixel area PA2, and a third pixel area PA3 may be provided in each virtual unit VU connecting the second openings 232. In FIG. 12, the virtual unit VU is defined for the convenience of a description and may have a square shape and the second openings 232 may be at four corners.

The first pixel area PA1, the second pixel area PA2, and the third pixel area PA3 emit light of different colors from one another. The first pixel area PA1 corresponds to a pixel emitting red light, the second pixel area PA2 corresponds to a pixel emitting blue light, and the third pixel area PA3 corresponds to a pixel emitting green light.

The red light, blue light, and green light emitted from the first to third pixel areas PA1, PA2, and PA3 are visible to the user, after the blue light emitted from the first to third organic light-emitting diodes is converted into another color or transmitted through the color panel as described above with reference to FIG. 5. Therefore, the first to third pixel areas PA1, PA2, and PA3 shown in FIG. 12 may respectively correspond to color areas R, B, and G of the color panel. For example, the first pixel area PA1 of FIG. 12 may correspond to a first color area (e.g., a red color area R) of the color panel, and the first color area R is surrounded by the light-blocking a and corresponds to an overlapping portion between the first color filter and the first color conversion portion described above with reference to FIG. 5. The second pixel area PA2 may correspond to a second color area (e.g., a blue color area B) of the color panel and the second color area B may correspond to an overlapping portion between the second color filter and the transmission portion. The third pixel area PA3 may correspond to a third color area (e.g., a green color area G) of the color panel and the third color area G may correspond to an overlapping portion between the third color filter and the second color conversion portion. The first to third pixel areas PA1, PA2, and PA3 of FIG. 12 respectively correspond to the first to third color areas R, B, and G surrounded by the light-blocking area BA. Thus, hereinafter the first to third pixel areas PA1, PA2, and PA3 may respectively denote the first to third color areas R, B, and G or the first to third color areas R, B, and G may respectively denote the first to third pixel areas PA1, PA2, and PA3. In an exemplary embodiment, the second color area B is smaller than each of the first color area R and the third color area G in size, and the second color area B is disposed between the first color area R and the third color area G. The present inventive concept is not limited thereto. In an exemplary embodiment, one of the first to third color areas R, B and G may be smaller than the others in size.

Widths among the neighboring color areas may be constant or the same. For example, a first width W1 between the first color area R and the second color area B may be substantially equal to a second width W2 between the second color area B and the third color area G. In other words, a width of a portion of the light-blocking area BA, between the first color area R and the second color area B, may be substantially equal to a width of another portion of the light-blocking area BA, between the second color area B and the third color area G.

Similarly, a third width W3 between the first color area R of the virtual unit VU and a color area adjacent thereto may be substantially equal to the first width W1 between the first color area R and the second color area B within the virtual unit VU. A fourth width W4 between the third color area G of the virtual unit VU and a color area adjacent thereto may be substantially equal to the second width W2 between the second color area B and the third color area G within the virtual unit VU.

A length L12 of the second color area B in the first direction may be less than a length L11 of the first color area R or a length L13 of the third color area G in the first direction. For example, the length L12 of the second color area B in the first direction may be less than each of the length L11 of the first color area R and the length L13 of the third color area G in the first direction. The second color area B may be located middle among the first to third color areas R, B, and G in the virtual unit VU. The present inventive concept is not limited thereto. In an exemplary embodiment, a color area in one of the first to third light-emitting diodes OLED1, OLED2 and OLED3 has a first length in the first direction, and the first length is less than a length of a color area in another one of the first to third light-emitting diodes OLED1, OLED2 and OLED3. As shown in FIG. 8, since the first to third storage capacitors Cst1, Cst2, and Cst3 are arranged in the first direction, one of the first to third color areas R, G, and G, e.g., the second color area B, may overlap the first to third storage capacitors Cst1, Cst2, and Cst3. Here, the second color area B may have a relatively smaller length L12 in the first direction for the electrical connection between the third pixel electrode 241c and the third storage capacitor Cst3 of the third organic light-emitting diode OLED3 (see FIG. 8) overlapping the third color area G. For example, an eighteenth contact hole CT18 for the electrical connection between the third pixel electrode 241c and the third storage capacitor Cst3 may be disposed between a third virtual line VL3 passing through one side edge of the second color area B and a fourth virtual line VL4 passing through one side edge of the third color area G. The third virtual line VL3 and the fourth virtual line VL4 may be respectively different from the first virtual line VL1 and the second virtual line VL2 of FIG. 8.

Each of the first to third color areas R, B, and G may at least partially overlap each of the first to third organic light-emitting diodes OLED1, OLED2, and OLED3, and a connection point between each of the first to third organic light-emitting diodes OLED1, OLED2, and OLED3 and an electronic element of the pixel circuit thereof may be covered by the light-blocking area BA. For example, the tenth contact hole CT10 for connecting the first storage capacitor Cst1 to the first pixel electrode 241a, the nineteenth contact hole CT19 for connecting the second storage capacitor Cst2 to the second pixel electrode 24b, and the eighteenth contact hole CT18 for connecting the third storage capacitor Cst3 to the third pixel electrode 241c may be covered by the light-blocking area BA, e.g., the light-blocking layer of the color panel.

Figure 13:
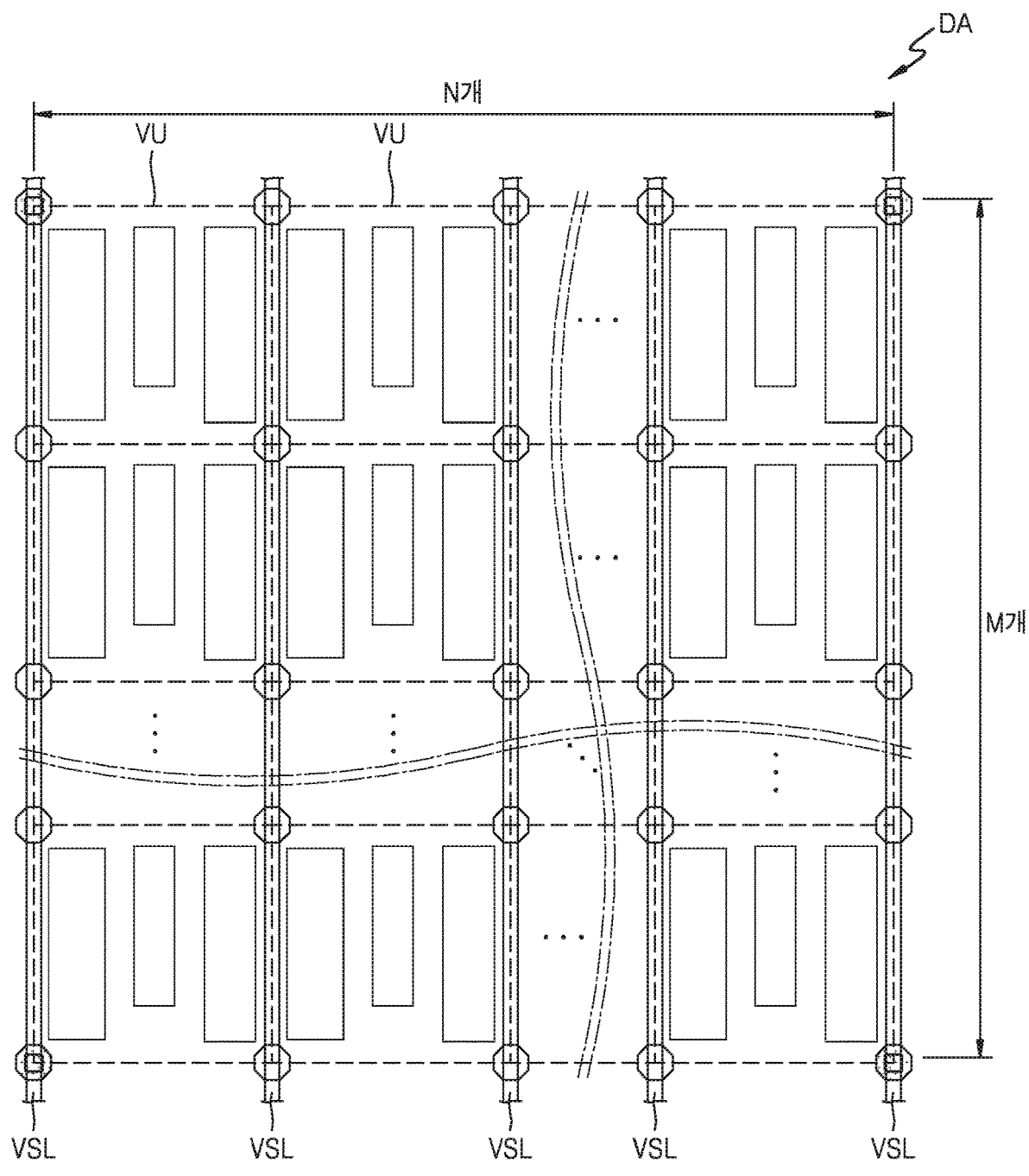
FIG. 13 is a plan view partially showing a display device according to an exemplary embodiment of the present invention.

FIG. 13 is a plan view partially showing a display device according to an exemplary embodiment.

Referring to FIG. 13, the plurality of common power voltage lines VSL may be spaced apart from one another in the display area DA of the display device, and the second openings 232 of the sixth insulating layer 230 may be spaced apart from one another and may expose the common power voltage lines VSL. The display area DA may have a structure in which the virtual units VU, each of which connects four adjacent second openings 232, are repeatedly located, as described above with reference to FIG. 12.

As described above with reference to FIGS. 8, 10, and 11, the second openings 232 are provided for the electrical connection between the opposite electrode and the common power voltage line VSL, but the electrical connection between the opposite electrode and the common power voltage line VSL via the second openings 232 may vary depending on whether there is the through hole in the intermediate layer 243 (see FIG. 10) in the second opening 232. For example, the through hole may be formed within some of the second openings 232 and may not be formed within the others.

In an exemplary embodiment, as shown in FIG. 13, the electrical connection point between the opposite electrode and the common power voltage line VSL, e.g., the overlapping structure between the second opening 232 of the sixth insulating layer and the through hole 243h in the intermediate layer, may be located at each of four corners of a virtual square surrounding M×N virtual units. Here, M and N each are 1 or greater natural number, and M and N may have the same value as each other or different values from each other. From among the plurality of second openings 232 included in M×N virtual units VU, the second openings 232 in which the through hole 243h of the intermediate layer is not provided may correspond to a kind of dummy connecting structure.

Figure 14:
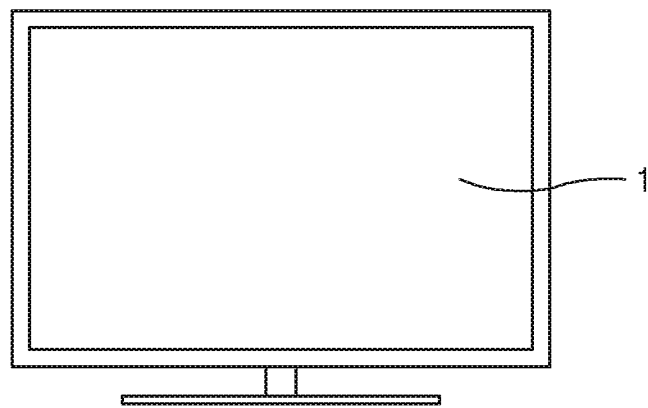
FIGS. 14 and 15 are diagrams of an electronic device including a display device according to an exemplary embodiment of the present invention.
Figure 15:
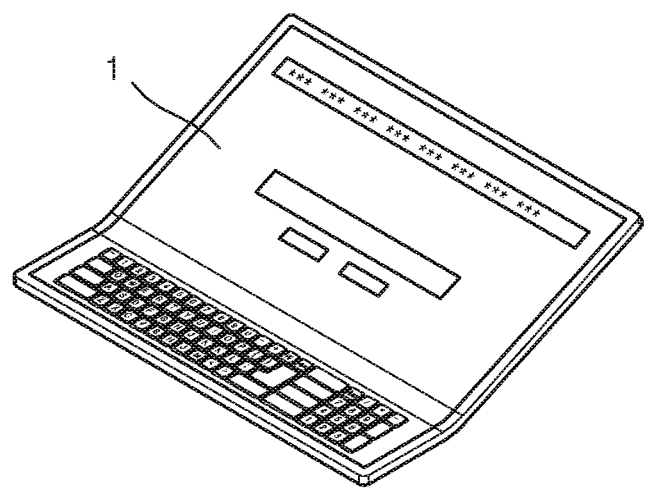

FIGS. 14 and 15 are diagrams of an electronic device including the display device 1 according to an exemplary embodiment.

Referring to FIGS. 14 and 15, the display device 1 may be included in an electronic device such as a television or a monitor, or an electronic device such as a laptop. Alternatively, the display device 1 may be used in various electronic devices, e.g., a smart frame or a large billboard.

The display device 1 may be not only used in an electronic device including a rectangular screen having a longer transverse side. For example, the display device 1 may be used in an electronic device having a rectangular screen that is longer in a longitudinal direction.

According to one or more exemplary embodiments, the display device may prevent degradation of displaying quality caused due to a voltage drop of the opposite electrode in a large-sized display device. Also, since the display device includes color elements that are arranged to have a predetermined rule, the processes of manufacturing the color conversion portion included in the color panel may be effectively performed, and the display elements and the pixel circuits electrically connected to the display elements may be arranged effective within a limited space. In addition, a sufficient capacitance of the storage capacitor may be ensured.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display device comprising:
 a light-emitting panel comprising a first light-emitting diode, a second light-emitting diode, and a third light-emitting diode; and
 a color panel on the light-emitting panel, the color panel comprising a first color area, a second color area, a third color area, and a light-blocking area,
 wherein the light-emitting panel comprises:
  two first power lines spaced apart from each other and each extending in a first direction;
  a first pixel circuit electrically connected to a first pixel electrode of the first light-emitting diode;
  a second pixel circuit electrically connected to a second pixel electrode of the second light-emitting diode;
  a third pixel circuit electrically connected to a third pixel electrode of the third light-emitting diode;
  a connecting electrode overlapping one of the two first power lines and electrically connected to the one of the two first power lines;
  an insulating layer on the connecting electrode, the insulating layer comprising first openings each overlapping the first, second, and third pixel electrodes, and a second opening overlapping the connecting electrode;
  an intermediate layer overlapping the first, second and third pixel electrodes via the first openings, a portion of the intermediate layer having a hole on the connecting electrode; and
  an opposite electrode on the intermediate layer, a portion of the opposite electrode being in direct-contact with the connecting electrode via the hole of the intermediate layer and the second opening of the insulating layer.

2. The display device of claim 1, wherein the first light-emitting diode, the second light-emitting diode, and the third light-emitting diode are spaced apart from one another between the two first power lines.

3. The display device of claim 1, wherein the intermediate layer comprises an emission layer and a functional layer, and the hole of the intermediate layer includes a first sub-hole passing through the emission layer and a second sub-hole passing through the functional layer.

4. The display device of claim 1, further comprising:
 at least one auxiliary line intersecting with the two first power lines,
 wherein the at least one auxiliary line is electrically connected to at least one of the two first power lines.

5. The display device of claim 1, wherein the color panel comprises:
 a light-blocking layer defining the light-blocking area;
 a color conversion-transmission layer comprising a plurality of color conversion portions configured to convert incident light into different color lights and a transmission portion configured to transmit the incident light; and
 a color layer comprising a plurality of color filters, each of the plurality of color filters overlapping a respective one of the transmission portion and the plurality of color conversion portions.

6. The display device of claim 5, wherein the plurality of color conversion portions comprises quantum dots.

7. The display device of claim 5, wherein the light-blocking layer overlaps a first connection point between the first pixel electrode and the first pixel circuit, a second connection point between the second pixel electrode and the second pixel circuit, and a third connection point between the third pixel electrode and the third pixel circuit.

8. The display device of claim 1, wherein:
 the first pixel circuit comprises a first storage capacitor, and the second pixel circuit comprises a second storage capacitor, and the third pixel circuit comprises a third storage capacitor, and
 wherein the first storage capacitor, the second storage capacitor, and the third storage capacitor are arranged in the first direction.

9. The display device of claim 8, wherein the second light-emitting diode overlaps a portion of each of the first, second, and third storage capacitors.

10. The display device of claim 1,
 wherein a first width between the first color area and the second color area is substantially equal to a second width between the second color area and the third color area.

11. A display device comprising:
 a first common power voltage line extending in a first direction;
 a second common power voltage line extending in the first direction and spaced apart from the first common power voltage line along a second direction crossing the first direction, wherein the first and second common power voltage lines are adjacent to each other;
 a first pixel circuit electrically connected to a first pixel electrode of a first light-emitting diode;
 a second pixel circuit electrically connected to a second pixel electrode of a second light-emitting diode;
 a third pixel circuit electrically connected to a third pixel electrode of a third light-emitting diode;
 a first connecting electrode overlapping the first common power voltage line;
 an insulating layer on the first connecting electrode, the insulating layer comprising first openings each overlapping the first, second, and third pixel electrodes, and a second opening overlapping the first connecting electrode;
 an intermediate layer overlapping the first, second and third pixel electrodes via the first openings; and
 an opposite electrode on the intermediate layer,
 wherein a first portion of the opposite electrode is in direct-contact with the first connecting electrode via a hole of the intermediate layer and the second opening of the insulating layer, and
 wherein the first light-emitting diode, the second light-emitting diode, and the third light-emitting diode are spaced apart from one another between the first and second common power voltage lines.

12. The display device of claim 11, wherein the first, second, and third pixel circuits are arranged between the first and second common power voltage lines.

13. The display device of claim 11, wherein the intermediate layer comprises an emission layer and a functional layer, and the hole of the intermediate layer includes a first sub-hole passing through the emission layer and a second sub-hole passing through the functional layer.

14. The display device of claim 11, further comprising:
 at least one auxiliary line extending in the second direction and intersecting with the first and second common power voltage lines, wherein the at least one auxiliary line is electrically connected to at least one of the first or second common power voltage lines.

15. The display device of claim 11, wherein:
the first pixel circuit comprises a first storage capacitor, and the second pixel circuit comprises a second storage capacitor, and the third pixel circuit comprises a third storage capacitor, and
wherein the first storage capacitor, the second storage capacitor, and the third storage capacitor are arranged in the first direction.

16. The display device of claim 15, wherein the second light-emitting diode overlaps a portion of each of the first, second, and third storage capacitors.

17. The display device of claim 11, further comprising:
a color conversion-transmission layer comprising a plurality color conversion portions configured to convert incident light into different color lights and a transmission portion configured to transmit the incident light;
a color layer comprising a plurality of color filters, each of the plurality of color filters overlapping a respective one of the transmission portion and the plurality of color conversion portions; and
a light-blocking layer.

18. The display device of claim 17, wherein the plurality of color conversion portions comprises quantum dots.

19. The display device of claim 17, wherein the light-blocking layer overlaps a first connection point between the first pixel electrode and the first pixel circuit, a second connection point between the second pixel electrode and the second pixel circuit, and a third connection point between the third pixel electrode and the third pixel circuit.

20. The display device of claim 11, wherein a first length of the first pixel electrode in the first direction is different from a second length of the second pixel electrode or a third length of the third pixel electrode.

* * * * *